(12) United States Patent
White et al.

(10) Patent No.: US 7,824,955 B2
(45) Date of Patent: Nov. 2, 2010

(54) HYBRID BEAM DEPOSITION SYSTEM AND METHODS FOR FABRICATING METAL OXIDE-ZNO FILMS, P-TYPE ZNO FILMS, AND ZNO-BASED II-VI COMPOUND SEMICONDUCTOR DEVICES

(75) Inventors: Henry W. White, Columbia, MO (US); Yungryel Ryu, Columbia, MO (US); Tae-seok Lee, Naperville, IL (US)

(73) Assignee: Moxtronics, Inc., Columbia, MO (US)

( * ) Notice: Subject to any disclaimer, the term of this patent is extended or adjusted under 35 U.S.C. 154(b) by 1386 days.

(21) Appl. No.: 10/525,611

(22) PCT Filed: Aug. 27, 2003

(86) PCT No.: PCT/US03/27143
§ 371 (c)(1), (2), (4) Date: Sep. 12, 2005

(87) PCT Pub. No.: WO2004/020686
PCT Pub. Date: Mar. 11, 2004

(65) Prior Publication Data
US 2006/0233969 A1     Oct. 19, 2006

Related U.S. Application Data

(60) Provisional application No. 60/406,500, filed on Aug. 28, 2002.

(51) Int. Cl.
*H01L 21/00*     (2006.01)
*H01L 21/16*     (2006.01)

(52) U.S. Cl. ........................ 438/104; 438/503; 438/507; 438/508; 438/758; 257/E21.084; 257/E21.08

(58) Field of Classification Search ................ 438/104, 438/503, 507, 508, 758; 257/E21.084, E21.08
See application file for complete search history.

(56) References Cited

U.S. PATENT DOCUMENTS 4,605,565 A * 8/1986 Nath .......................... 427/576

(Continued)

FOREIGN PATENT DOCUMENTS

EP     0591 607 A2     4/1994

(Continued)

OTHER PUBLICATIONS

European Patent Office report in related counterpart application EP 03791949.5 dated Sep. 7, 2006.

(Continued)

*Primary Examiner*—Charles D Garber
*Assistant Examiner*—Angel Roman
(74) *Attorney, Agent, or Firm*—Jacobs & Kim LLP; David Jacobs

(57) ABSTRACT

A hybrid beam deposition (HBD) system and methods according to the present invention utilizes a unique combination of pulsed laser deposition (PLD) technique and equipment with equipment and techniques that provide a radical oxygen rf-plasma stream to effectively increase the flux density of available reactive oxygen at a deposition substrate for the effective synthesis of metal oxide thin films. The HBD system and methods of the present invention further integrate molecular beam epitaxy (MBE) and/or chemical vapor deposition (CVD) techniques and equipment in combination with the PLD equipment and technique and the radical oxygen rf-plasma stream to provide elemental source materials for the synthesis of undoped and/or doped metal oxide thin films as well as the synthesis of undoped and/or doped metal-based oxide alloy thin films.

29 Claims, 20 Drawing Sheets

U.S. PATENT DOCUMENTS

| | | | |
|---|---|---|---|
| 4,983,540 | A | 1/1991 | Yamaguchi et al. |
| 5,686,151 | A * | 11/1997 | Imai et al. .................. 427/576 |
| 5,849,630 | A | 12/1998 | Johnson |
| 5,858,477 | A | 1/1999 | Veerasamy et al. |
| 6,046,464 | A | 4/2000 | Schetzina |
| 2001/0036214 | A1 | 11/2001 | Bozovic et al. |
| 2002/0025594 | A1* | 2/2002 | Iwata et al. .................. 438/46 |

FOREIGN PATENT DOCUMENTS

| | | |
|---|---|---|
| EP | 1 054 082 A1 | 11/2000 |
| EP | 1 081 256 A2 | 3/2001 |

OTHER PUBLICATIONS

Ko, H.J. et al. "Photoluminescence properties of ZnO epilayers grown on $CaF_2(111)$ by plasma assisted molecular beam epitaxy." Applied Physics Letters, vol. 76, No. 14, Apr. 3, 2000, pp. 1905-1907.

Ryu, Y.R. et al. "Properties of arsenic-doped $p$-type ZnO grown by hybrid beam deposition." Applied Physics Letters, vol. 83, No. 1, Jul. 7, 2003, pp. 87-89.

Ryu, Y.R. et al. "Synthesis of p-type ZnO films." Journal of Crystal Growth, 216 (2000), pp. 330-334.

Kumano, H. et al. "Luminescence properties of ZnO films grown on GaAs substrates by molecular-beam epitaxy excited by electron-cyclotron resonance oxygen plasma." Journal of Crystal Growth 214/215 (2000), pp. 280-283.

López, J. García et al. "Role of the oxygen plasma during in situ growth of $YBa_2Cu_3O_{6+x}$ thin films by pulsed laser deposition." Physica C 307 (1998), pp. 298-306.

Tsurumi, Takaaki et al. "Electric Properties of Zinc Oxide Epitaxial Films Grown by Ion-Beam Sputtering with Oxygen-Radical Irradiation." Japanese Journal of Applied Physics, vol. 38 (1999), pp. 3682-3688.

Ryu, Y.R. et al. "Fabrication of homostructural ZnO p-n junctions." Journal of Crystal Growth 219 (2000), pp. 419-422.

* cited by examiner

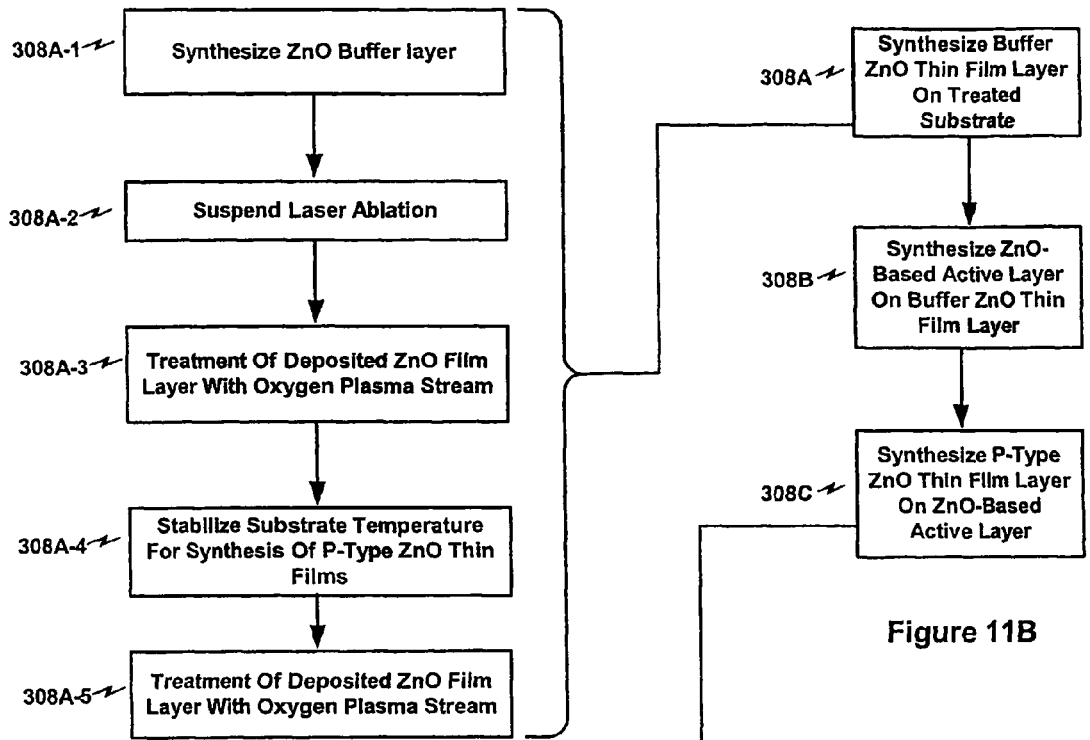
Figure 11C
Figure 11B
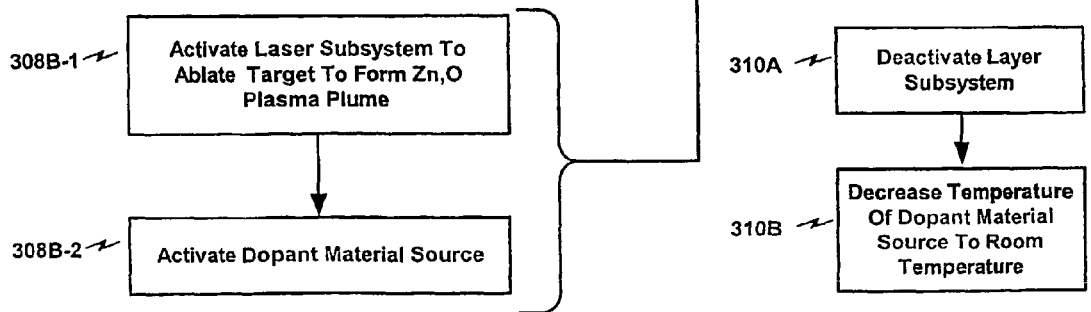
Figure 11D
Figure 11E

HYBRID BEAM DEPOSITION SYSTEM AND METHODS FOR FABRICATING METAL OXIDE-ZNO FILMS, P-TYPE ZNO FILMS, AND ZNO-BASED II-VI COMPOUND SEMICONDUCTOR DEVICES

CROSS-REFERENCE TO RELATED APPLICATIONS

The present application is based upon and claims priority from International Application No. PCT/US03/27143, filed Aug. 27, 2003, and entitled "A Hybrid Beam Deposition System and Methods for Fabricating Metal Oxide-ZnO Films, P-Type ZnO Films, and ZnO-Based II-VI Compound Semiconductor Devices." and U.S. provisional patent application Ser. No. 60/406,500, filed Aug. 28, 2002, entitled "Hybrid Beam Deposition System And Method For Fabricating Metal Oxide ZnO Films, P-Type ZnO Films, And ZnO-Based II-VI Group Compound Semiconductor Devices".

BACKGROUND OF THE INVENTION (1) Field of the Invention

This invention relates generally to systems and methods for forming metal oxide and metal-based oxide alloy films for semiconductor applications, and, more particularly, to a hybrid beam deposition (HBD) system and methods for fabricating metal oxide ZnO films, p-type ZnO films, and ZnO-based II-VI group compound semiconductor devices such as light-emitting diodes (LEDs), laser diodes (LDs), photodetectors, and gas sensors and bipolar/unipolar semiconductor devices such as heterojunction bipolar transistors (HBT) and field-effect transistors (FET)s.

(2) Description of Related Art

Zinc oxide (ZnO) films have been extensively studied for use in piezoelectric and waveguide devices. GaN is known in the prior art as a good material for the fabrication of optical devices such as blue light emitting devices (blue LEDs) and blue laser diodes (blue LDs). GaN has been utilized in an effort to increase the average lifetime of blue LDs up to 10,000 hours at room temperature. ZnO thin films are possible substitutes for gallium nitride (GaN) film applications because the optical properties of ZnO films are very similar to those of GaN and both materials possess the same crystal structure, i.e., wurtzite, with small lattice mismatch.

ZnO films represent potential candidates for short-wavelength (ultraviolet/violet/blue) optoelectrical and optical applications based upon similarities in crystal structure and optical properties between ZnO films and GaN films. ZnO has physical characteristics that make it a more attractive candidate than GaN for such applications. For example, high quality ZnO films having very low defect densities can be synthesized, high-quality ZnO substrates are available for homoepitaxial growth, ZnO films provide an emission source for very pure monochromatic light, and ZnO, which is a wide band-gap semiconductor material ($E_g$ of approximately 3.4 eV at room temperature), is a relatively hard material. The strength of the Zn-to-O bond of ZnO is greater than the Ga-to-N bond of GaN. This difference in bonding strength can lead to significantly different results for p-type doping. ZnO has a melting temperature of approximately 2000° C. (versus a melting temperature of approximately 1700° C. for GaN). Thus, ZnO is sufficiently stable with respect to the high temperature annealing and treatment processes associated with doping and the formation of ohmic contacts as well as device fabrication. Other attractive characteristics of ZnO thin films include: very strong spontaneous and stimulated emissions by excitons (even at room temperature); and the ready availability of large-area ZnO substrates.

The practical development of semiconductor devices based upon ZnO films requires the ability to consistently and expeditiously fabricate both n-type and p-type ZnO films of high quality. A variety of techniques are known in the prior art for fabricating or synthesizing thin films for different applications, including semiconductor applications. Such techniques include chemical vapor deposition (CVD), molecular beam epitaxy (MBE), and pulsed laser deposition (PLD). Specialized variations of these techniques, e.g., electron cyclotron resonance chemical vapor deposition (ECR-CVD), metal organic chemical vapor deposition (MOCVD), solid-source or gas-source MBE (SMBE or GMBE), which emphasize the physical aspects of the deposition-material sources, are also known in the art for fabricating or synthesizing thin films.

Although PLD is one of the best growth methods for oxide materials, it needs to be improved for synthesizing high-quality ZnO films. For example, a target for laser ablation should provide uniformity in mixing dopant material with pure ZnO material for the synthesis of uniformly doped ZnO films. The mixture ratio of dopant material to host ZnO material in such a target should simultaneously be very adaptable to obtain any level of the carrier density required for semiconductor device applications. Unfortunately, it is very difficult to prepare a target satisfying these conditions.

Among the foregoing techniques, the MBE technique is very useful for synthesizing high-quality thin films and fabricating quantum-well devices, especially when the deposition-material sources have low melting temperatures and high evaporation pressures such that crystal formation can be achieved under low temperature and low pressure conditions. For example, GaAs and zinc selenide (ZnSe) films are suitable candidates for synthesis using MBE. One conventional MBE technique utilizes separated sources comprising a pure zinc molecular beam and a pure oxygen molecular beam to synthesize ZnO films. The effective pressure ratio of the oxygen to zinc constituents is a critical constraint for synthesizing high-quality ZnO films using this MBE technique. The oxygen constituent should be over pressured to avoid any oxygen vacancies. Over pressurization of the oxygen constituent, however, in this MBE technique is limited due to the adverse effects of oxidation on the MBE equipment, which limits the maximum rate of high-quality ZnO film growth. Conventional CVD techniques are also subject to such oxidation limitations.

It is generally known that the crystal qualities for SiC and GaN films grown at a high temperature and in a high pressure would be better than those for SiC and GaN films grown at a low temperature and in a low pressure. The growth of SiC and GaN films at a high temperature and in a high pressure is performed by using the MOCVD technique. For these reasons, the MOCVD technique becomes a common technique to fabricate short-wavelength light emitting devices, for example, with GaN-based materials. Compared to the MOCVD technique, however, the MBE technique is not good for the growth of wide band-gap hard materials such as SiC and GaN, but it is still preferable since the process for MBE film growth is simpler, more clearly understandable, and more easily controllable than the MOCVD technique.

A need exists to provide one or more simple and efficient techniques and the concomitant equipment for synthesizing undoped (semi-insulating) and doped (both n-type and/or p-type) ZnO thin films having lower values of electrical resistivity and higher values of Hall mobility for semiconductor applications. Such techniques and equipment should facilitate synthesis of such ZnO films at relatively low oxygen pressures while concomitantly providing a flux density of available reactive oxygen that accommodates a maximum growth rate of high-quality metal oxide thin films.

BRIEF SUMMARY OF THE INVENTION

A hybrid beam deposition (HBD) system and methods according to the present invention utilizes a unique combination of a pulsed laser deposition (PLD) technique and equipment with equipment and techniques that provide a radical oxygen rf-plasma stream to effectively increase the flux density of available reactive oxygen at a deposition substrate for the effective synthesis of metal oxide thin films. The HBD system and methods of the present invention further integrate molecular beam epitaxy (MBE) and/or chemical vapor deposition (CVD) techniques and equipment in combination with the PLD equipment and technique and the radical oxygen rf-plasma stream to provide elemental dopant for the synthesis of doped metal oxide thin films.

BRIEF DESCRIPTION OF THE DRAWINGS

A more complete understanding of the present invention and the attendant features and advantages thereof can be had by reference to the following detailed description of the invention when considered in conjunction with the accompanying drawings wherein:

FIG. 11B illustrates the thin film synthesis substeps for the light-emitting semiconductor device of FIG. 10 using the HBD method of FIG. 11.

FIG. 11C illustrates the process stages for synthesizing a buffer thin film layer as one of the synthesis substeps of FIG. 11B.

FIG. 11D illustrates the process stages for synthesizing a ZnO-based active layer as one of the synthesis substeps of FIG. 11B.

FIG. 11E illustrates the substeps for terminating the synthesis process of the HBD method of FIG. 11.

FIG. 16D illustrates the process stages for synthesizing a p-type ZnO:As thin film layer as one of the synthesis substeps of FIG. 16B.

DETAILED DESCRIPTION OF THE INVENTION

Figure 1:
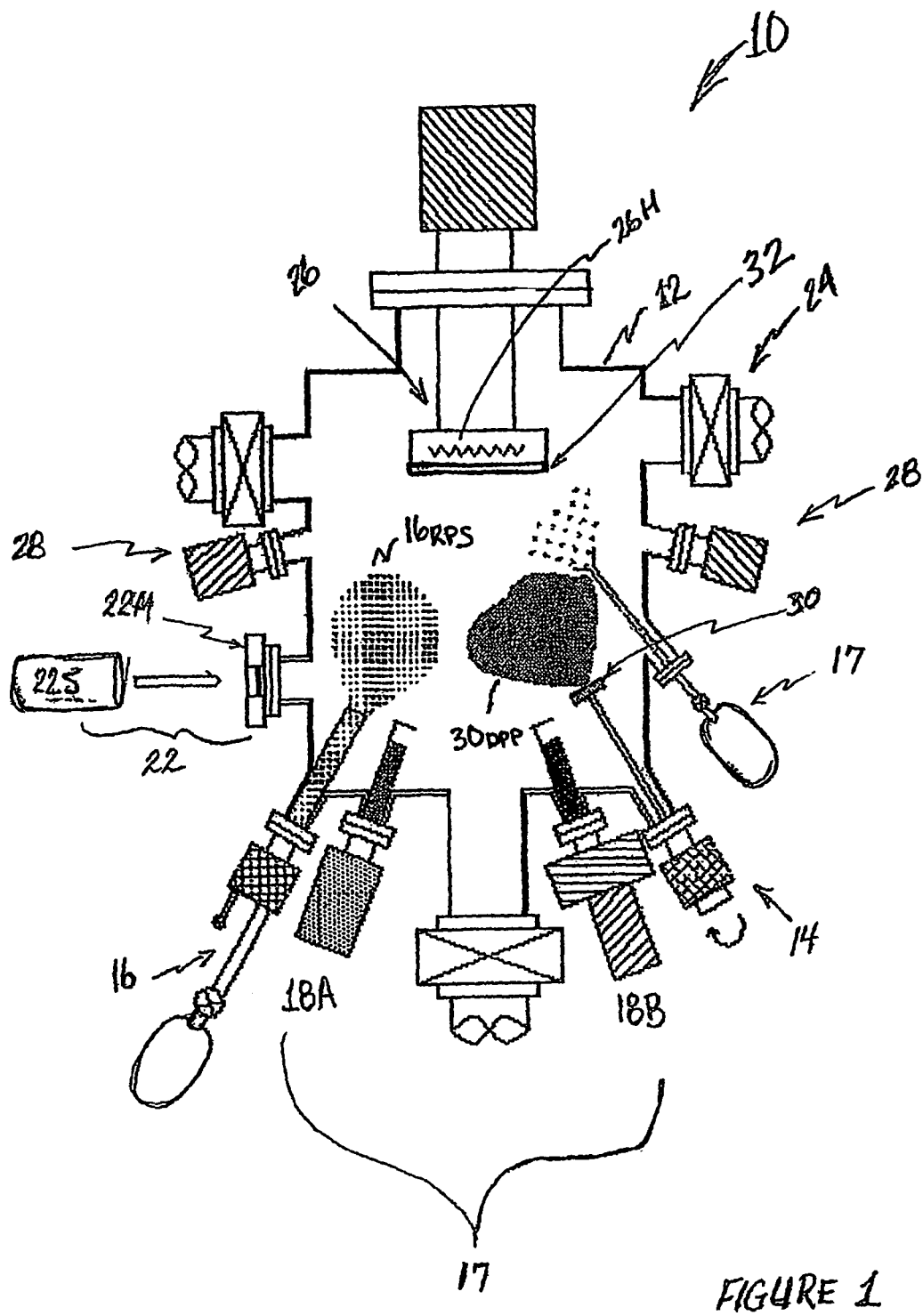
FIG. 1 illustrates an embodiment of a hybrid beam deposition (HBD) system according to the present invention.

Referring now to the drawings wherein like reference numerals indicate corresponding or similar elements throughout the several views, FIG. 1 illustrates a hybrid beam deposition (HBD) system 10 of the present invention for synthesizing high quality metal oxide films such as ZnO thin film layers and fabricating semiconductor devices embodying such n-type and p-type ZnO thin film layers. The HBD system 10 utilizes a unique combination of pulsed laser deposition (PLD) with a radical oxygen rf-plasma steam to effectively increase the flux density of available reactive oxygen for the effective synthesis of metal oxide thin layer films. The HBD system 10 further integrates molecular beam epitaxy (MBE) and/or chemical vapor deposition (CVD) techniques in combination with the PLD equipment and the radical oxygen rf-plasma stream to synthesize thin films that include dopant atoms.

The HBD system 10 includes a deposition chamber 12, a target assembly 14, an rf reactive gas source 16, a source material subsystem 17 that preferably comprises one or more solid source devices 18 and/or a gas/chemical vapor apparatus 20, a metal oxide plasma generating (MOPG) subsystem 22, an evacuation assembly 24, a substrate assembly 26, and a measurement device 28. The deposition chamber 12 is configured and fabricated to provide the means for integrating the target assembly 14, the rf reactive gas source 16, the source material subsystem 17, the MOPG subsystem 22, the evacuation assembly 24, the substrate assembly 26, and the measurement device 28 in combination therewith. The deposition chamber 12 also functions as the containment structure for the target and source materials and reactive gas utilized in thin film synthesis using the HBD methods according to the present invention over the predetermined temperature and pressure ranges thereof.

The target assembly 14 comprises a mechanism that is configured and operative to mount a target 30 within the deposition chamber 12, to position such target 30 with respect to the laser subsystem 22 and the substrate assembly 26, and to rotate the target 30 during ablation thereof. The target 30 is a metal oxide selected in accordance with the type of metal oxide film to be synthesized as is known to those skilled in the art. For film synthesis using the HBD methods according to the present invention described herein, the target 30 comprises a slug of pure zinc oxide (polycrystalline ZnO).

The RF reactive gas source 16 is operative to introduce an rf reactive gas plasma stream (see reference numeral $16_{RPS}$ in FIG. 1) into the deposition chamber 12 to provide the reactive gas working environment for metal oxide thin film synthesis using the HBD methods according to the present invention. For the described HBD methods, the rf plasma stream is an rf oxygen plasma stream that increases the efficiency of binding Zn-to-O for ZnO crystallization while concomitantly maintaining the pressure inside the deposition chamber 12 at a low level, e.g., approximately $10^{-5}$ Torr.

The source material subsystem 17, e.g., one or more solid source devices 18 and/or the gas/chemical vapor apparatus 20, provides the means for introducing one or more source materials, in an elemental and/or gaseous form, respectively, into the deposition chamber 12 for growth of undoped metal-based oxide alloy films and/or doped metal oxide films and/or metal-based oxide alloy films, e.g., p- or n-type ZnO films, ZnO-based alloy films, using the HBD methods according to the present invention. One or more solid source devices 18, such as a Knudsen-type effusion cell (K-cell) 18A and an E-beam cell 18B evaporator as exemplarily illustrated in FIG. 1, are the preferred means for effectively introducing source materials in an elemental form into the deposition chamber 12 in a low pressure working environment, e.g., less than $10^{-5}$ Torr. One skilled in the art will appreciate that the solid source devices 18 could also include one or more cracker cells in addition to, or in lieu of, the K-cell 18A and/or the E-beam cell 18B. The gas/chemical vapor apparatus 20 provides another means for effectively introducing source material in a gaseous form into the working environment of the deposition chamber 12 in a high pressure environment, particularly under conditions where oxidation may pose a problem, in a manner similar to the doping procedure utilized in the MOCVD process. The source material subsystem 17 provides enhanced flexibility in introducing source materials in elemental and/or gaseous form into the working environment of the deposition chamber 12 as compared with conventional MBE, CVD, and PLD techniques.

The MOPG subsystem 22 is configured and operative to ablate or evaporate the target material 30 to form a high energy directional metal, oxide plasma plume such as Zn, O (see reference numeral 30DPP in FIG. 1) within the deposition chamber 12 for film synthesis using the HBD methods according to the present invention. The MOPG subsystem 22 includes a source 22S for generating the ablation/evaporation beam utilized in the HBD methods of the present invention (e.g., a laser beam for pulsed laser deposition or an electron beam for electron beam evaporation) and a mechanism 22M for directing and focusing the generated ablation/evaporation beam onto the target 30 mounted in the target assembly 14 in the deposition chamber 12 (e.g., a focusing lens for the laser beam or a focusing magnet/electromagnet for the electron beam). For the embodiments of the HBD methods described herein using the HBD system 10 according to the present invention, the MOPG subsystem 22 is a laser subsystem wherein the beam source 22S is a pulsed argon fluoride (ArF) excimer laser operating at 193 nm.

The high energy directional plasma plume of Zn, O generated by ablation of the target 30 by means of the laser beam source 22S and the rf oxygen plasma stream injected by the rf reactive gas source 16 in combination effectively increase the flux density of available reactive oxygen in the working environment adjacent the substrate assembly 26, thereby facilitating the synthesis of high-quality doped or undoped metal oxide films and doped or undoped metal-based oxide alloy films using the HBD system 10 according to the present invention.

The evacuation assembly 24 is configured and operative to continuously evacuate unused oxygen gas from the deposition chamber 12 during thin film synthesis, thereby enhancing the effectiveness of the working environment within the deposition chamber 12 that is continuously recharged by the rf oxygen plasma stream emitted from the rf reactive gas source 16 using the HBD methods of the present invention described herein. For the described embodiment, the evacuation assembly 24 includes an rf cracker pointed at the entrance of the turbo-molecular pump of the evacuation assembly 24. The entrance dimension (for the described embodiment 8 inches) is greater than the dimensions of the rf oxygen plasma stream injected by the rf reactive gas source 16, and, due to these geometric conditions, the background dynamical pressure for thin film synthesis within the deposition chamber 12 can be maintained at low levels as required.

The substrate assembly 26 is configured and operative to position a substrate 32 within the deposition chamber 12 so that the high energy directional Zn, O plasma plume generated by the laser beam source 22S, the rf oxygen plasma stream injected by the rf reactive gas source 16, and any source material(s) introduced by the source material subsystem optimally impinge upon the substrate 32 for film synthesis by deposition The substrate assembly 26 also includes an oxygen resistant heater 26H such as a silicon carbide (SiC) or a molybdenum silicide ($MoSi_2$) heater that is operative to transfer thermal energy to the substrate 32 to stimulate elemental diffusion or migration as required during thin film synthesis using the HBD methods of the present invention.

For the embodiment of the HBD system 10 described above, the distance between the target 30 and the substrate 32 is within the range of about 1 cm to about 100 cm, and preferably approximately 18 cm; the distance between the rf reactive gas source 16 and the substrate 32 is within the range of about 5 cm to about 100 cm, and preferably approximately 14 cm; the distance between the solid source devices 18 and the substrate 32 is within the range of about 5 cm to about 100 cm, and preferably approximately 17 cm; and the distance between the gas/chemical vapor subsystem 20 and the substrate 32 is within the range of about 5 cm to about 100 cm, and preferably approximately 15 cm.

The measurement device 28 provides the means to measure the thickness of any thin film (or combination of films) being synthesized on the substrate 32. For the described embodiment of the HBD system 10 illustrated in FIG. 1, the measurement device 28 is an ellipsometer that is configured and operative to measure the thickness of semi-transparent thin films. This ellipsometer 28 comprises two complementary units wherein one unit consists of a helium/neon (He/Ne) laser and a polarizer and the complementary unit consists of an analyzer and a detector.

Figure 2:
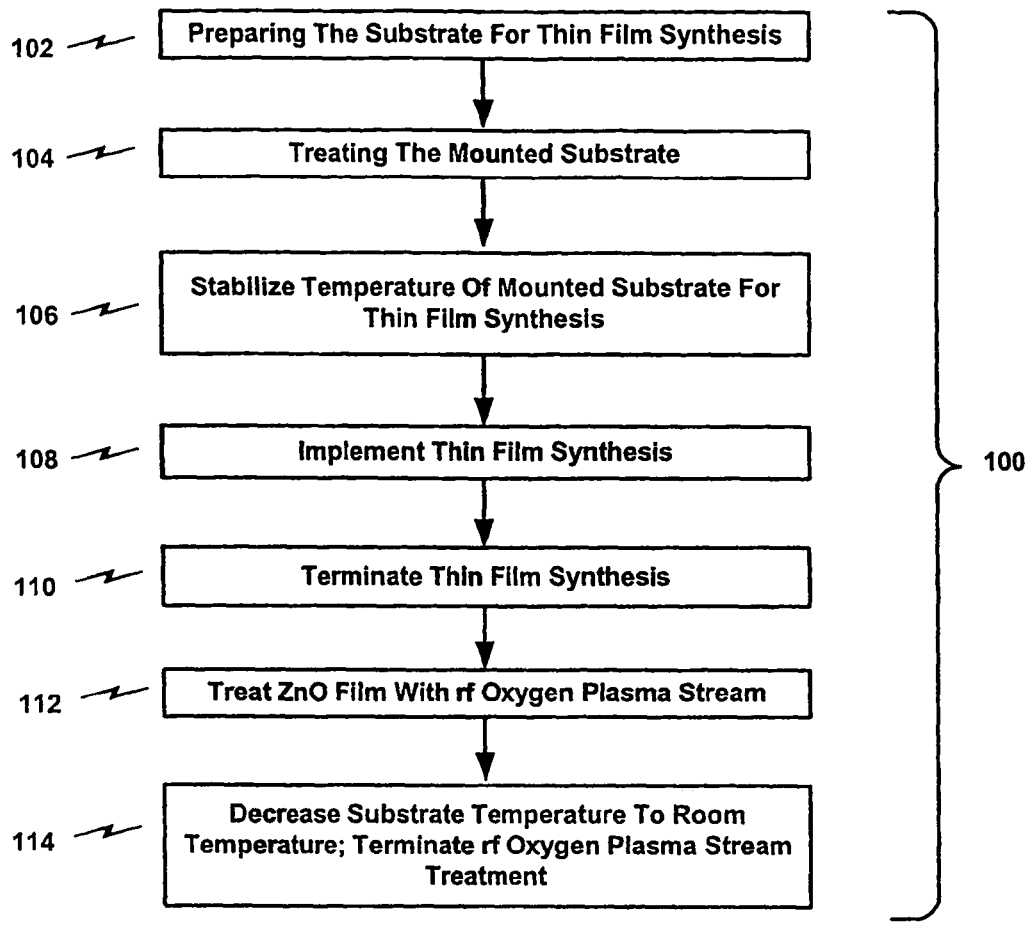
FIG. 2 illustrates one embodiment of an HBD method according to the present invention for synthesizing ZnO thin films using the HBD system of FIG. 1.

FIG. 2 illustrates one embodiment of an HBD method 100 according to the present invention for synthesizing an undoped ZnO thin film layer using the HBD system 10 described above. For this HBD method 100, the substrate 32 was an (0001)-$Al_2O_3$ material (sapphire) and the target 30 was a slug of polycrystalline zinc oxide (ZnO).

Figure 2A:
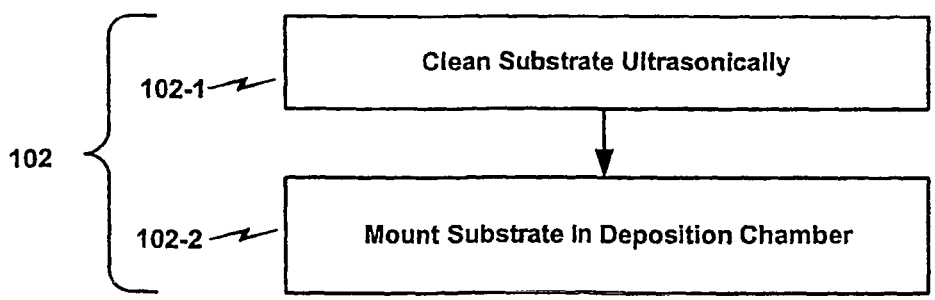
FIG. 2A illustrates two substeps for the step of preparing the substrate for thin film synthesis for the HBD method illustrated in FIG. 2.

In a first step 102, the substrate 32 is prepared for film synthesis. While this preparation step 102 may consist solely of a step of mounting the substrate 32 in combination with the substrate assembly 26, it is preferable to 'decontaminate' the substrate 32 prior to mounting. Accordingly, the substrate 32 is decontaminated in a substep 102-1 by cleaning the substrate 32 ultrasonically using pure acetone, then methanol, and finally with deionized water at a temperature within the range of about room temperature to about 200° C., preferably approximately 70° C., for a period of about 10 minutes in each solution, and then bathing the substrate 32 several times, preferably twice, with deionized pure water at a temperature within the range of about room temperature to about 200° C., preferably approximately 70° C., for a period of about 10 minutes. In a substep 102-2 the decontaminated substrate 32 is then mounted in the deposition chamber 12 using the substrate assembly 26 (see FIG. 2A).

In a step 104, the mounted substrate 32 is further treated by directing the rf oxygen plasma stream from the rf reactive gas source 16 onto the synthesis surface of the mounted substrate 32 under predetermined conditions, i.e., treatment period, rf power level, and temperature and pressure levels of the working environment within the deposition chamber 12. To wit, the rf oxygen plasma stream is directed onto the mounted substrate 32 for a predetermined treatment period within the range of about 30 seconds to about 3 hours, and preferably approximately 30 minutes. The rf reactive gas source 16 is operated at a predetermined rf power level within the range of about 100 W to about 2000 W, and preferably approximately 350 W. The predetermined treatment temperature of the working environment within the deposition chamber 12 is maintained within the range of about 200° C. to about 2000° C., and preferably at approximately 800° C., and the predetermined dynamical pressure of the rf oxygen plasma stream within the deposition chamber 12 is maintained within the range of about $1\times10^{-6}$ Torr to about $1\times10^{-2}$ Torr, and preferably at approximately $1\times10^{-5}$ Torr.

Next, in a step 106 the temperature of the mounted substrate 32 is stabilized at a predetermined synthesis temperature within the range of about 200° C. to about 1500° C., and preferably at approximately 650° C. Temperature changes in the mounted substrate 32 are effected at a predetermined rate within the range of about 1° C./min to about 100° C./min, and preferably at approximately 20° C./min to stabilize the mounted substrate 32 at the predetermined synthesis temperature.

After the mounted substrate 32 is stabilized at the predetermined synthesis temperature, thin film synthesis is implemented in a step 108. For the HBD method 100, implementation comprises the activation of the laser subsystem 22 and maintaining the working environment of the deposition chamber 12 at a predetermined dynamical pressure and the mounted substrate 32 at the predetermined synthesis temperature established in step 106. The pulsed ArF excimer laser beam generated by the activated laser subsystem 22 is focused on the target 30, causing ablation thereof, to generate the high energy directional plasma plume of Zn, O that is deposited on the synthesis surface of the substrate 32 to synthesize a ZnO thin film layer. The laser subsystem 22 is operated under predetermined synthesis conditions including pulse rate, pulse energy level synthesis (deposition) period, and target rotational rate. The laser beam source 22S is operated at a predetermined pulse rate within the range of about 1 Hz to about 5 kHz, and preferably at approximately 10 Hz. The pulsed laser beam has a predetermined pulse energy level within the range of about 10 mJ to about 1000 mJ, and preferably approximately 100 mJ. The predetermined synthesis period was approximately 30 minutes. The target assembly 14 is operated to rotate the target 30 at a predetermined rotational rate within the range of about 0.5 rpm to about 10 rpm, and preferably at approximately 1 rpm. The dynamical background pressure of the rf oxygen plasma stream is maintained at the pressure defined in step 104 and the substrate 32 is maintained at the predetermined synthesis temperature defined in step 106.

Next, in a step 110 the film synthesis process is terminated once the predetermined synthesis period has elapsed. This entails deactivation of the laser subsystem 22.

After deactivation of the laser subsystem 22, the ZnO film formed during step 108 is treated with the rf oxygen plasma stream generated by the rf reactive gas source 16 for a predetermined treatment period and at a predetermined dynamical pressure (the substrate 32 is maintained at the predetermined synthesis temperature established in step 106) in step 112 to complete the synthesis of a ZnO thin film layer using the HBD method 100 according to the present invention. The predetermined treatment period is within the range of about 1 minute to about 10 hours, and preferably approximately 30 minutes. The predetermined dynamical pressure is within the range of about $1\times10^{-6}$ Torr to about $1\times10^{-2}$ Torr, and preferably approximately $5\times10^{-5}$ Torr.

After the predetermined treatment period has elapsed, the substrate 32 temperature is decreased to room temperature at a predetermined rate in step 114. The predetermined rate for decreasing the substrate 32 temperature is within the range of about 1° C./min to about 100° C./min, and preferably approximately 10° C./min. Once the substrate 32 has been stabilized at room temperature, the if oxygen plasma stream is terminated by deactivating the rf reactive gas source 16 to complete step 114.

Figure 3:
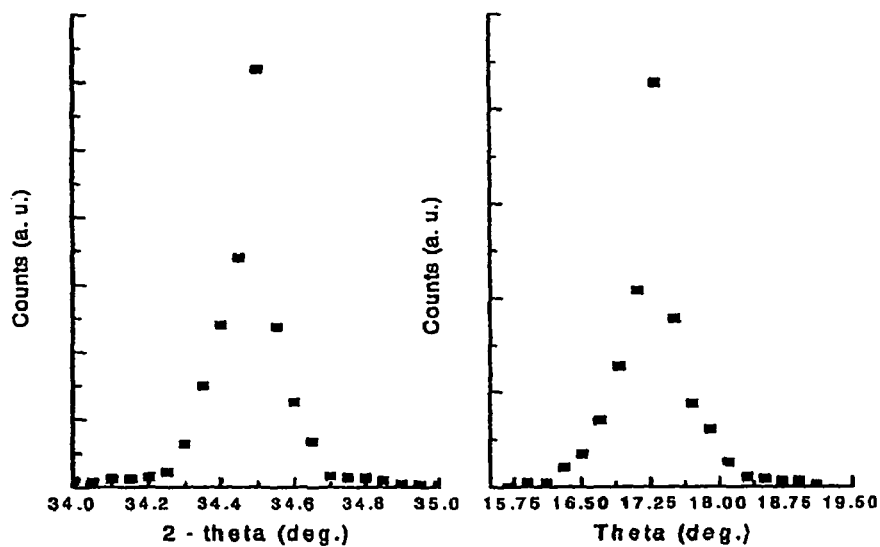
FIG. 3 depicts X-ray theta-2theta curves for the (0002) plane of a ZnO thin film synthesized using the HBD method of FIG. 2.

To study the crystalline morphology of a ZnO thin film synthesized using the HBD method 100 described in the preceding paragraphs, such ZnO film was measured by x-ray diffraction (XRD) using Cu K$\alpha_1$ radiation. The thickness of such ZnO film used for XRD measurement is about 650 Å. FIG. 3 shows the (0002)-peak for a ZnO film synthesized by means of the HBD method 100. The peak is located at 2θ=34.55°. The peak position indicates that the lattice constant of the ZnO thin film perpendicular to the substrate is diminished to 5.185 Å—as compared with the lattice constant 5.213 Å of bulk ZnO—due to tensile strain caused by lattice mismatch (about 32%) between the film and the sapphire substrate 32. The FWHM of the theta-rocking curve for the (0002) peak is about 5 arcmin, which is satisfactory for optoelectrical applications. The XRD results are one of the best ever reported. The ZnO thin film synthesized on the sapphire substrate 32 has a hexagonal structure according to the in plane XRD measurement. These XRD results might be improved by further refining the synthesis parameters for the HBD method 100 and/or by incorporating post-annealing steps as part of the HBD method 100. The high crystal quality of ZnO thin film synthesized using the HBD method 100 described above indicates that the HBD method 100 has a high utility for synthesizing single-crystal ZnO thin films.

Figure 4:
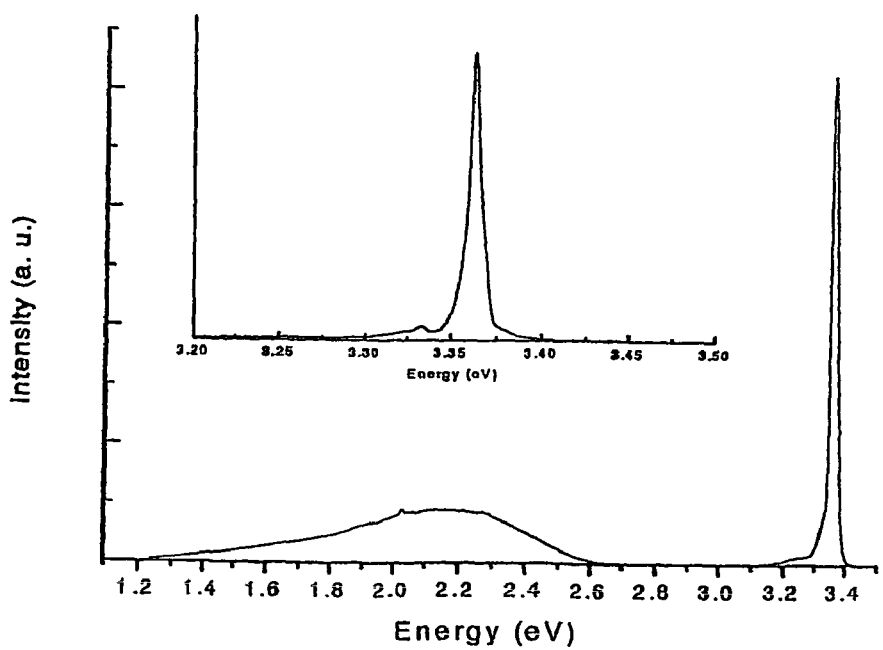
FIG. 4 illustrates the photoluminescence (PL) spectra of a ZnO thin film synthesized using the HBD method of FIG. 2.

Photoluminescence (PL) spectroscopy measurements were performed to examine the optical properties of a ZnO thin film synthesized by the HBD method 100 described above. A helium-cadmium (He—Cd) laser of 325 nm wavelength was used for photo-excitation of such ZnO thin film. A PL spectrum at 11° K of the ZnO film is shown in FIG. 4. The narrow, strong peak at 3.362 eV is the donor-bound excitonic emission. Its FWHM is less than 6 meV, which is one of the best results ever encountered. Compared with the PL results of ZnO film synthesized by the PLD technique, the optical quality of ZnO film synthesized by the HBD method 100 according to the present invention is an improvement over ZnO thin films using prior art PLD techniques. The broad peaks at about 2.2 eV are attributed to structural defects in the synthesized ZnO thin film. These structural defects may be the result of a lattice mismatch phenomenon.

Figure 5:
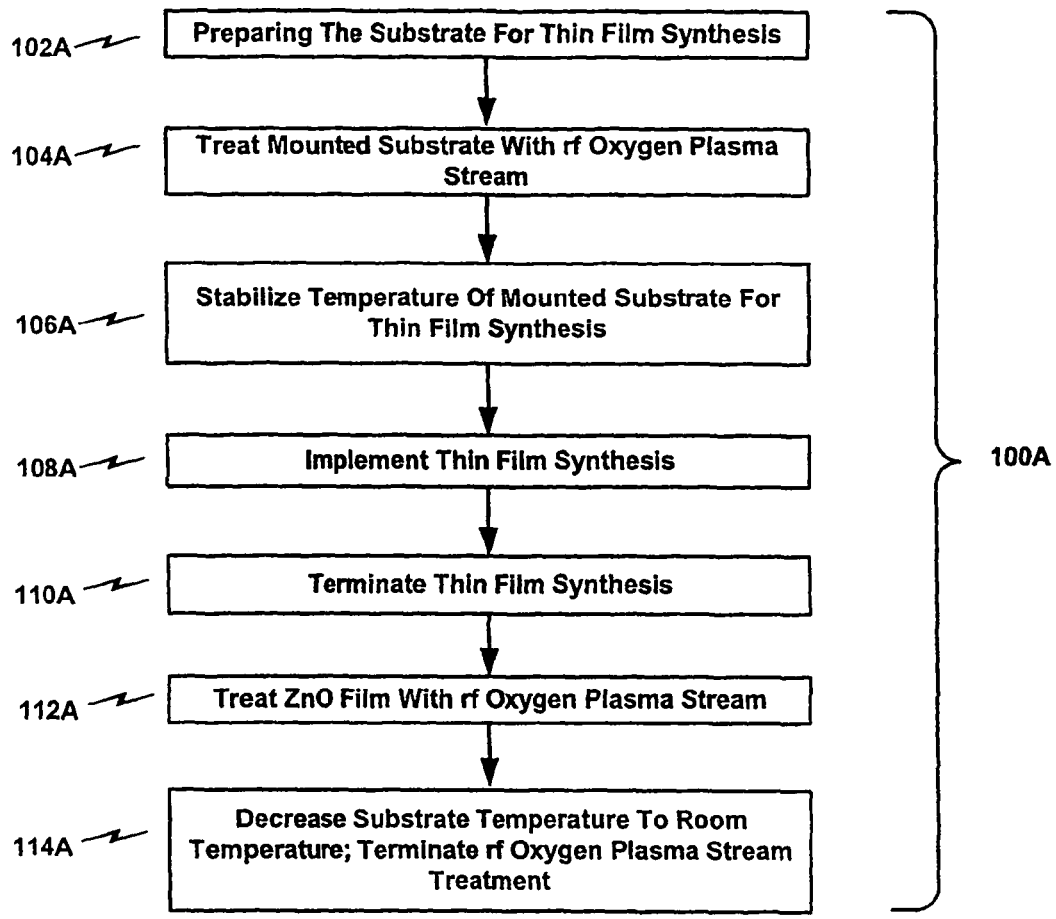
FIG. 5 illustrates an alternate embodiment of the HBD method of FIG. 2 for synthesizing ZnO thin films using the HBD system of FIG. 1.
Figure 5A:
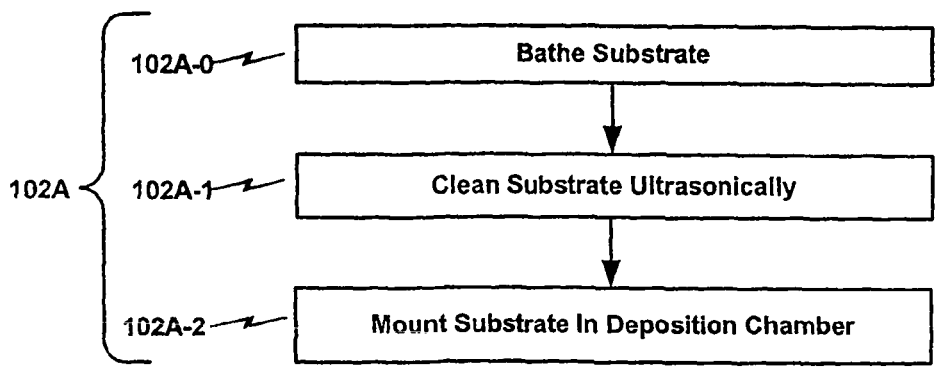
FIG. 5A illustrates three substeps for the step of preparing the substrate for thin film synthesis for the HBD method illustrated in FIG. 5.

An alternative embodiment of an HBD method 100A according to the present invention is illustrated in FIGS. 5, 5A. This HBD method 100A is similar to the HBD method 100 described above except that this HBD method 100A is based upon synthesizing a ZnO thin film having predetermined thicknesses within the range of 0.5 to 1 micrometer (rather than the HBD method 100 which is based upon synthesizing ZnO thin films for a predetermined synthesis period). For this HBD method 100A, the substrate 32 is preferably a substance such as ZnO or SiC instead of sapphire. The target 30 is preferably polycrystalline ZnO.

The preparation step 102A of the HBD method 100A is similar to the preparation step 102 of the HBD method 100 described above except for an additional decontamination substep implemented prior to ultrasonic cleaning of the substrate 32. In a substep 102A-0 the substrate 32 is first cleaned in one or more solvents to help smooth the synthesis surface thereof to facilitate the synthesis of high-quality thin films. Representative examples of the type of solvents that can be used in the bathing substep 102A-0 include trichloroethanol, trichloroethylene, trichloromethane, trichloroethane, and trichloroacetic acid, with trichloroethane being preferred. The substrate 32 is first bathed with trichloroethane for a period of within the range about 1 minute to about 60 minutes, and preferably for approximately 10 minutes, at a temperature within the range of about room temperature to about 200° C., preferably approximately 70° C., and then bathed with deionized pure water for a period within the range of about 1 minute to about 60 minutes, and preferably for approximately 10 minutes, at a temperature within the range of about room temperature to about 200° C., preferably approximately 70° C., to complete substep 102A-0. Substeps 102A-1 and 102A-2 of the HBD method 100A are the same as substeps 102-1 and 102-2, respectively, of the HBD method 100 described above.

Likewise, steps 104A, 110A, 112A, and 114A of the HBD method 100A are the same as steps 104, 110, 112, and 114, respectively, of the HBD method 100 described above. Step 106A of the HBD method 100A is similar to step 106 of the HBD method 100 described above except that the predetermined synthesis temperature is preferably approximately 550° C. (instead of 650° C. in step 106 of the HBD method 100 described above). The predetermined synthesis temperature range of step 106A is the same as that described in step 106 above, and the rate-of-temperature-change range and the preferred change-of-temperature rate for step 106A are the same as those described in step 106 above.

Step 108A of the HBD method 110A is similar to step 108 of the HBD method 100 described above except that the parameter controlling the synthesis process, i.e., when synthesis is terminated, is the thickness of the ZnO thin film being synthesized (as opposed to time, i.e., the predetermined synthesis period, as the factor controlling synthesis in step 108 of the HBD method 100). Step 108A is deemed complete when the ZnO film being synthesized on the substrate 32 has a predetermined thickness within the range of about 0.5 microns to about 1 micron, and preferably approximately 0.7 microns. The measurement device 28 is monitored during the synthesis process of step 108A to identify the point at which the ZnO thin film being synthesized has attained the predetermined synthesis thickness.

Figure 6:
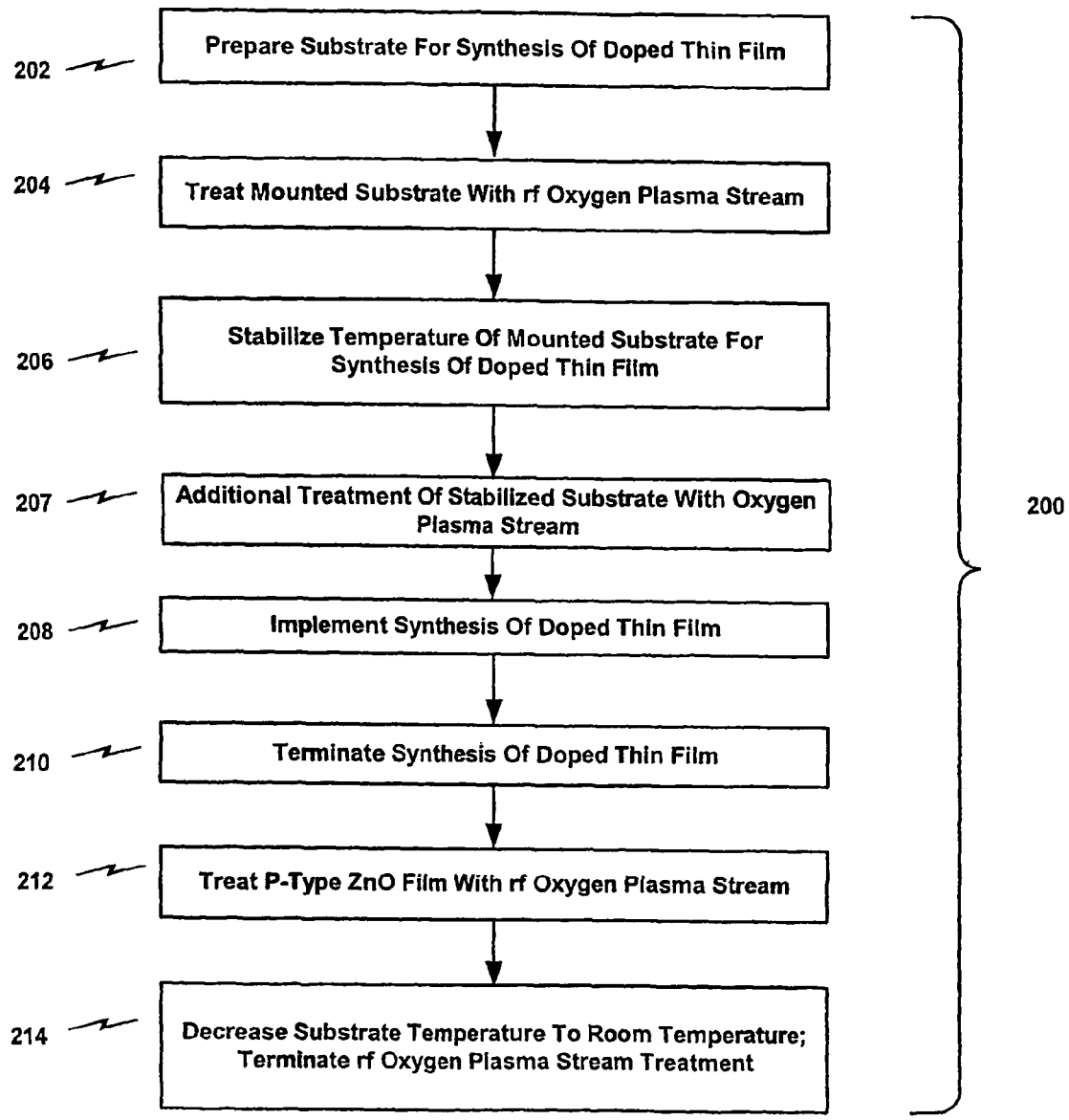
FIG. 6 illustrates an embodiment of an HBD method according to the present invention for synthesizing p-type ZnO thin films using the HBD system of FIG. 1.

FIG. 6 illustrates an embodiment of an HBD method 200 according to the present invention for synthesizing a p-type (doped) ZnO thin film using the HBD system 10 described above. The HBD method 200 encompasses the same steps (and conditions) as the HBD method 100A described above with the exception of an additional treatment step following temperature stabilization of the mounted substrate, the step of implementing thin film synthesis, and the step of terminating thin film synthesis, which are discussed in further detail below. The HBD method 200 is described herein in terms of arsenic (As) as the dopant material for synthesizing a p-type ZnO film. One skilled in the art will appreciate that dopant materials other than As can be used in the HBD method 200 according to the present invention and still be within the scope thereof.

Once the temperature of the mounted substrate 32 has been stabilized in step 206 (see specifics disclosed for step 106A above), the stabilized substrate 32 is subjected to an additional treatment with an oxygen plasma stream under predetermined conditions, i.e., treatment period and predetermined dynamical pressure, in a step 207 (mounted substrate 32 is maintained at the predetermined synthesis temperature achieved in step 206). The predetermined dynamical pressure of the oxygen plasma stream is within the range of about $1\times10^{-6}$ Torr to about $1\times10^{-2}$ Torr, and preferably approximately $1\times10^{-5}$ Torr. The predetermined treatment period is within the range of about 1 second to about 2 hours, and preferably approximately 10 minutes.

Figure 6A:
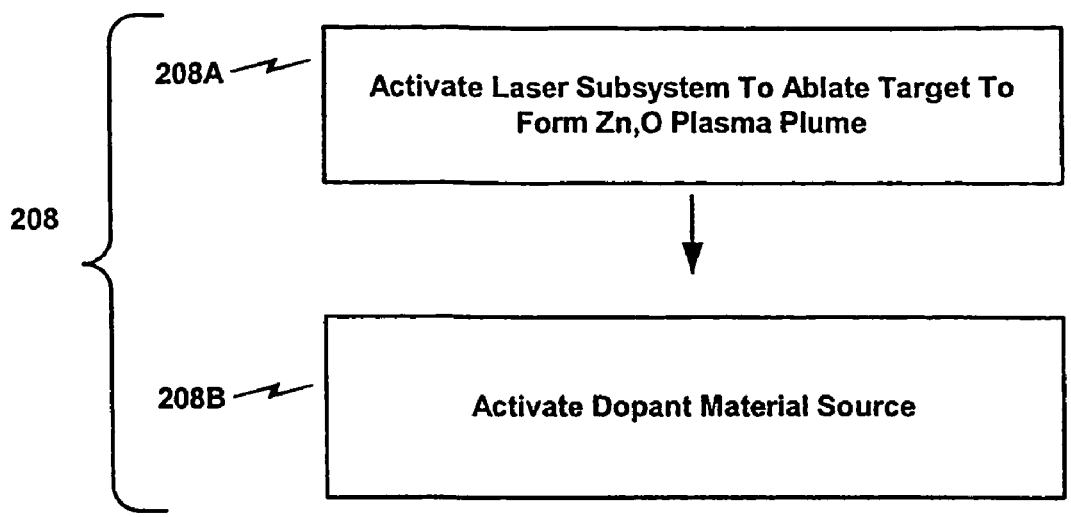
FIG. 6A illustrates the substeps of the HBD method of FIG. 6 for implementing the synthesis of p-type ZnO thin films.

In step 208, the process for synthesizing a doped metal oxide (e.g., ZnO) thin film is implemented. As illustrated in FIG. 6A, step 208 comprises substeps 208A and 208B. In substep 208A the laser beam source 22S is operated to generate the pulsed ArF excimer laser beam that is focused on the target 30, causing ablation thereof, to generate the high energy directional plasma plume of Zn, O that is deposited on the substrate 32 for synthesis of a doped ZnO thin film. The operating parameters for the laser beam source 22S in this step 208A are the same as those described above in connection with step 108A of the HBD method 100A.

In step 208B one or more of the source material means described above in connection with FIG. 1, i.e., subsystems 18 and/or 20, is/are activated to provide a dopant (elemental) stream that is simultaneously deposited on the substrate 32 for synthesis of the doped ZnO film. For the described embodiment of the HBD method 200, the K-cell 18A is operative to provide an As molecular beam that is operative to provide element As that is deposited on the substrate 32 to synthesize a p-type ZnO thin film. In step 208B, the temperature of the K-cell 18A is gradually increased from room temperature to a predetermined synthesis temperature at a predetermined rate. The predetermined rate is within the range of about 1° C./min to about 100° C./min, and preferably about 30° C./min. The predetermined synthesis temperature of the K-cell 18A is within the range of about 50° C. to about 400° C., and preferably between 120° C. and 200° C. One skilled in the art will appreciate that the As doping concentration can be varied by changing the predetermined synthesis temperature of the K-cell 18A to vary the carrier concentration of the p-type ZnO thin film being synthesized. Once the K-cell 18A is stabilized at the predetermined synthesis temperature, the shutter of the K-cell 18A is opened to direct the As molecular beam at the substrate 32 for synthesis of the p-type ZnO thin film.

As in step 108A of the HBD method 100 described above, the dynamical pressure of the rf oxygen plasma stream is maintained at the pressure defined in step 204 during the step 208 deposition proceedings, and in a similar manner, the substrate 32 is maintained at the predetermined synthesis temperature defined in step 206 during the step 208 deposition proceedings. The measurement device 28 is monitored during the synthesis process of step 208 to identify the point at which the ZnO thin film being synthesized has attained the predetermined synthesis thickness. For the described embodiment, the predetermined synthesis thickness of the p-type ZnO film is within the range of about 0.5 microns to about 1 micron, and preferably approximately 0.7 microns.

Figure 6B:
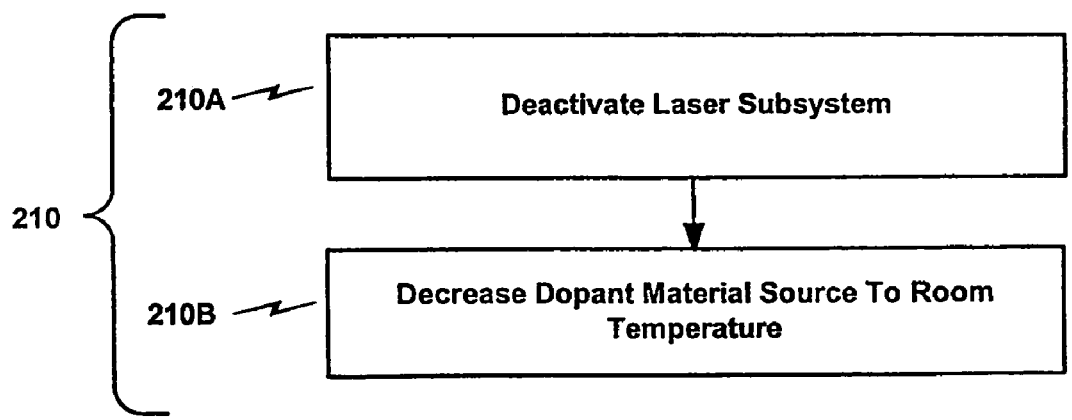
FIG. 6B illustrates the substeps of the HBD method of FIG. 6 for terminating the synthesis of p-type ZnO thin films.

In step 210, the process for synthesizing the doped thin film is terminated once the p-type ZnO film has attained the predetermined synthesis thickness. As illustrated in FIG. 6B, step 210 comprises substeps 210A and 210B. In step 210A the laser subsystem 22 is deactivated. In step 210B, the temperature of the K-cell 18A is decreased to room temperature at a predetermined rate wherein the predetermined rate is within the range of about 1° C./min to about 400° C./min, and preferably about 100° C./min.

Steps 212 and 214 of the HBD method 200 are the same as steps 112A and 114A, respectively, of the HBD method 100A described above (including the disclosed operating parameters or conditions).

Figure 7:
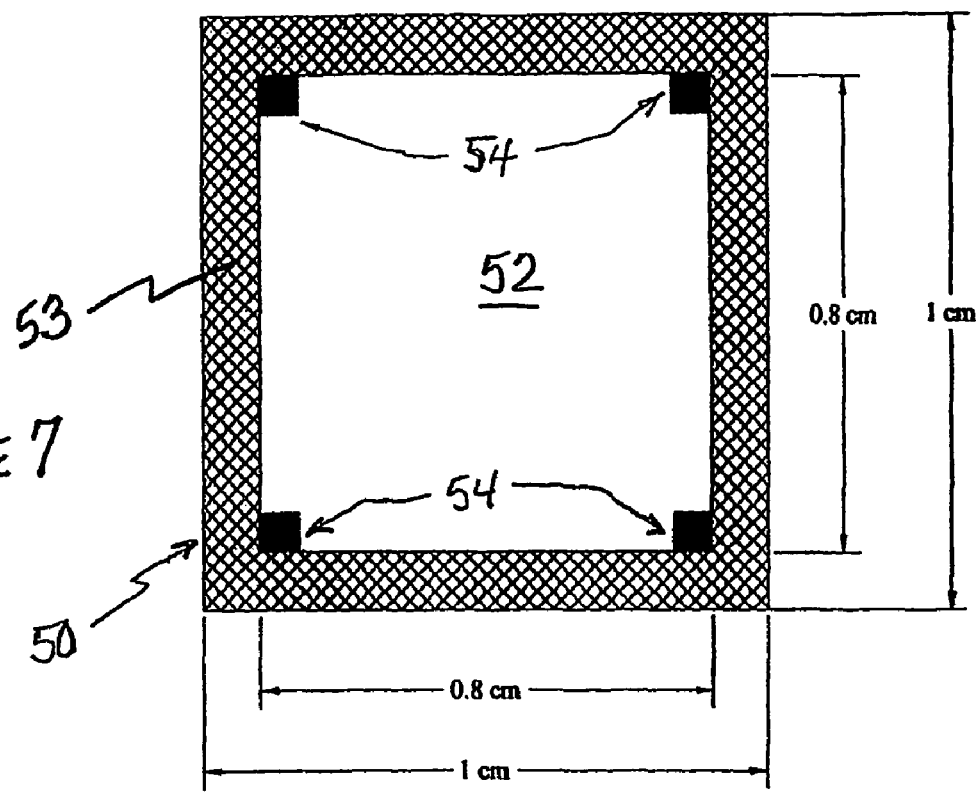
FIG. 7 is a schematic illustrating metallic contacts adhered to a p-type ZnO film synthesized using the HBD method of FIG. 6.

The p-type ZnO thin films synthesized using the HBD method 200 described in the preceding paragraphs, i.e., ZnO:As thin films, can be processed to include metallic (ohmic) contacts, thereby allowing such ZnO:As thin films to be used in a variety of circuit and/or device applications. To process such a ZnO:As thin film configuration 50, the ZnO:As thin film configuration 50 is first patterned and then etched with dilute (about 10% molar concentration) hydrochloric acid to form a mesa surface pattern 52 having lateral dimensions of about 0.8 cm by 0.8 cm as exemplarily illustrated in FIG. 7. This pattern-etching process results in the removal of ZnO:As thin film in a perimeter strip (see reference numeral 53 in FIG. 7) from the ZnO:As thin film configuration 50. The mesa surface 52 is then patterned to form contact sites (e.g., at the four corners of the ZnO:As film) for the adherence of metallic contacts 54 to the mesa surface 52 of the ZnO:As film configuration 50 where such metallic contacts 54 preferably have a bilayer configuration.

Such bilayer metallic contacts 54 adhered to the ZnO:As film can be comprised of one or more materials selected from the group of metallic elements Be, Al, Ti Cr, Fe, Co, Ni, Cu, Zn, Rh, Pd, Ag, In, Te, Ta, W, Ir, Pt, Au. A preferable metallic contact material for achieving suitable ohmic contact on ZnO:As thin films contains at least two metals selected from the group of metallic elements Be, Co, Ni, Rh, Pd, Te, Ir, Pt, Au. One preferred embodiment of a bilayer metallic contact 54 for providing suitable ohmic contacts on the ZnO:As film comprises the combination of Ni and Au.

To evaluate the electrical characteristics of bilayer metallic contacts 54 in adhered combination with ZnO:As thin films, several different bilayer metallic contacts were formed on ZnO:As films using either In, Ti, or Ni as the first metallic layer, followed by a second metallic layer of Au. These metallic layers can be deposited by any conventional method such as vapor deposition or sputtering, preferably by thermal or electron beam evaporation. The thickness of the In, Ti, or Ni first metallic layer was in the range of about 1 nm to about 1000 nm, and preferably approximately 30 nm. The thickness of the Au second metallic layer was in the range of about 1 nm to about 1000 nm, and preferably approximately 100 nm. The dimensions of the metallic contact 54 were in the range of about $0.1 \times 0.1$ $\mu m^2$ to about $1000 \times 1000$ $\mu m^2$, and preferably approximately $300 \times 300$ $\mu m^2$.

Figure 8A:
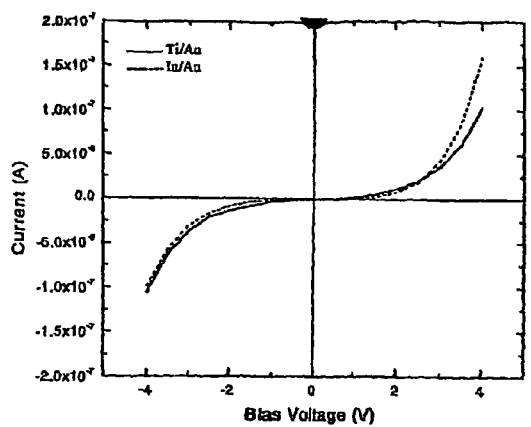
FIG. 8A illustrates the current-voltage characteristics of Ti—Au and In—Au bilayer metallic contacts adhered to a p-type ZnO film synthesized using the HBD method of FIG. 6.
Figure 8B:
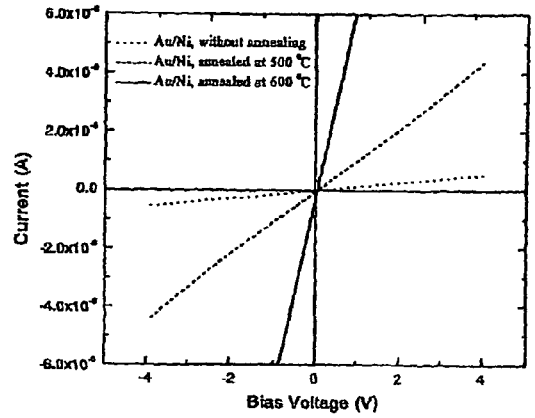
FIG. 8B illustrates the current-voltage characteristics of Ni—Au bilayer metallic contacts adhered to a p-type ZnO film synthesized using the HBD method of FIG. 6, with and without post-adherence annealing.

The current-voltage (I-V) characteristics of each of the foregoing bilayer metallic combinations were evaluated to determine the effectiveness of the metal-to-ZnO:As thin film contact. The I-V characteristics of these bilayer metallic combinations are illustrated in FIGS. 8A, 8B. Bilayer metallic combinations of In/Au to ZnO:As thin films and of Ti/Au to ZnO:As thin films are Schottky-like, as shown in FIG. 8A. Reliable data for electrical properties such as carrier type and concentration, mobility could not be derived from the Hall effect measurements due to the presence of these Schottky barriers. On the other hand, the Ni/Au bilayer metallic combination adhered to the same ZnO:As thin film exhibited linear I-V characteristics, as depicted in FIG. 8B. These results demonstrate clearly the necessity of choosing the proper metals and bilayer combinations thereof in order to obtain a suitable ohmic contact to ZnO:As thin films. A bilayer metallic contact of Ni/Au metals is ohmic to a ZnO:As thin film.

It was also determined that an annealing process at a high temperature in the range of about 100° C. to 1500° C., and preferably in the range of about 500° C. to about 600° C., for an annealing period within the range of about 1 second to about 1 hour, and preferably in the range of about 0.1 minutes to about 10 minutes, in an inert gas environment such as nitrogen, oxygen, or an atmospheric environment that was oxygen rich, provided a significant decrease in contact resistance and significant increase in contact adhesion. For example, the I-V characteristics for Ni—Au bilayer metallic contacts are illustrated in FIG. 8B, which illustrates the improvement in current carrying characteristics versus voltage where Ni—Au bilayer metallic contacts are subjected to annealing for 10 seconds at 500° C. or 600° in a nitrogen environment.

The electrical properties of ZnO:As films fabricated using the HBD method 200 described above, which had Ni—Au bilayer metallic contacts adhered thereto, were examined by Hall effect measurements. Such Hall measurement results are summarized in Table 1.

TABLE 1

| Sample No. | As Doping Level ($cm^{-3}$) | Resistivity ($\Omega \cdot cm$) | Carrier Density ($cm^{-3}$) | Mobility ($cm^2/V \cdot sec$) | Carrier Type |
|---|---|---|---|---|---|
| 10 | Undoped | 0.09 | $\sim 2 \times 10^{18}$ | 34 | n |
| 11 | $1.7 \times 10^{17}$ | 61 | $\sim 6 \times 10^{15}$ | 17 | n |
| 12 | $1 \times 10^{18}$ | 12 | $\sim 9 \times 10^{16}$ | 6 | p |
| 13 | $3 \times 10^{18}$ | 2 | $\sim 4 \times 10^{17}$ | 35 | p |
| 14 | $9 \times 10^{18}$ | 13 | $\sim 8 \times 10^{16}$ | 6 | p |

The electrical behavior of ZnO:As thin films changes from intrinsic n-type to highly conductive p-type with increased As-dopant concentration. For example, Sample No. 13, doped at $3 \times 10^{18}$ $cm^{-3}$, had a $4 \times 10^{17}$ $cm^{-3}$ hole concentration and 35 $cm^2$/V-sec mobility. Holes are the major carriers in ZnO:As films, for which the thermal activation energy is about 129 meV, as derived from temperature-dependent Hall effect measurements. Table 1 indicates that hole carrier concentration increases as the As-doping concentration increases, but then decreases if the As-doping level is increased beyond a certain point. Such phenomena might be associated with correlated dopant-induced defects. For suitable p-type conduction required by a ZnO device, the As-doping concentration is preferably within the range of about $1 \times 10^{15}$ to about $1 \times 10^{21}$ $cm^{-3}$, preferably between $1 \times 10^{16}$ and $5 \times 10^{20}$ $cm^{-3}$.

The results from Hall effect measurement show that ZnO:As films deposited on Zn-face ZnO substrates have n-type conductivity, while ZnO:As films on O-face ZnO substrates have p-type conductivity. The difference in conductivity type may be due to the fact that when ZnO:As thin films are exposed to air after growth, the surface of the ZnO:As thin film that is deposited on Zn-Face ZnO can be modified in such a manner as to show n-type conductivity which may arise from the effects of atmospheric contamination to the surface, e.g., due to the penetration of water or hydrogen into the ZnO film. However, ZnO:As deposited on O-face ZnO is more stable and inactive with regard to atmospheric contamination than it would be when deposited on a Zn-face ZnO surface.

Therefore, a layer for protecting the ZnO:As surface from atmospheric contamination should be considered to minimize any negative effects due to atmospheric contamination. Materials for such a protective layer may be comprised from one or more materials selected from $Al_2O_3$, $HfO_2$, MgO, BeO, $Si_3N_4$, $SO_2$, $TiO_2$, NiO, $Cr_2O_3$, ZnS, preferably $Al_2O_3$, $HfO_2$, MgO, BeO, $SiO_2$.

Figure 9A:
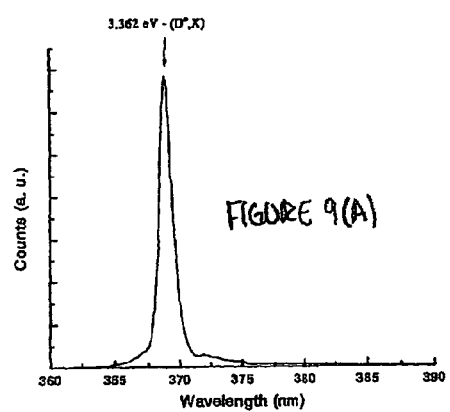
FIG. 9A illustrates the PL spectra for an undoped ZnO sample at 10 degrees Kelvin (10 K).
Figure 9B:
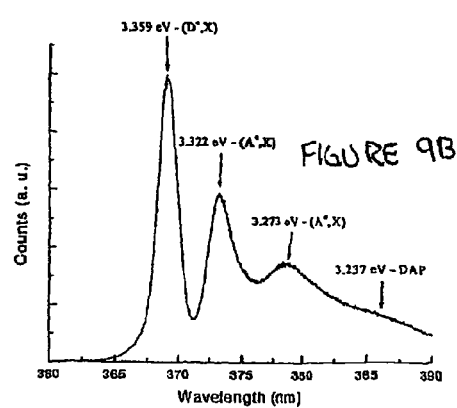
FIG. 9B illustrates the PL spectra of a lightly-doped ZnO sample at 10 K ($N_{As}$~low $10^{18}$ cm$^{-3}$).
Figure 9C:
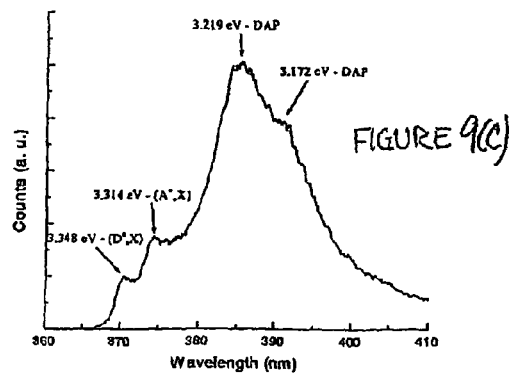
FIG. 9C illustrates the PL spectra of a heavily-doped ZnO sample at 10 K ($N_{As}$~low $10^{20}$ cm$^{-3}$).

The optical properties of the ZnO:As thin films at 10 K were measured with photoluminescence (PL) spectrometry. Undoped, lightly-doped, and heavily-doped ZnO:As thin film samples show As-related peaks, as depicted in FIGS. 9A, 9B, and 9C, respectively. Peaks at 3.322 and 3.273 eV are attributed to the As-acceptor (FA), and the peak at 3.359 eV is attributed to the band edge (A°, X). The donor-to-acceptor (DAP) peaks are located near 3.219 and 3.172 eV, as shown in the PL spectra for the heavy-doped ZnO:As sample. As deduced from variable temperature PL and reflectance measurements on lightly-doped ZnO:As thin films, the optical binding energies for the two different As-acceptor levels associated with the peaks located at 3.322 and 3.273 eV are about 115 meV and 164 meV, respectively. The thermal activation energy of 129 meV, derived from the temperature-dependent Hall effect measurements, appears to be an average value of these binding energies. Within the uncertainties of the measurements, these values are consistent with each other.

Figure 10:
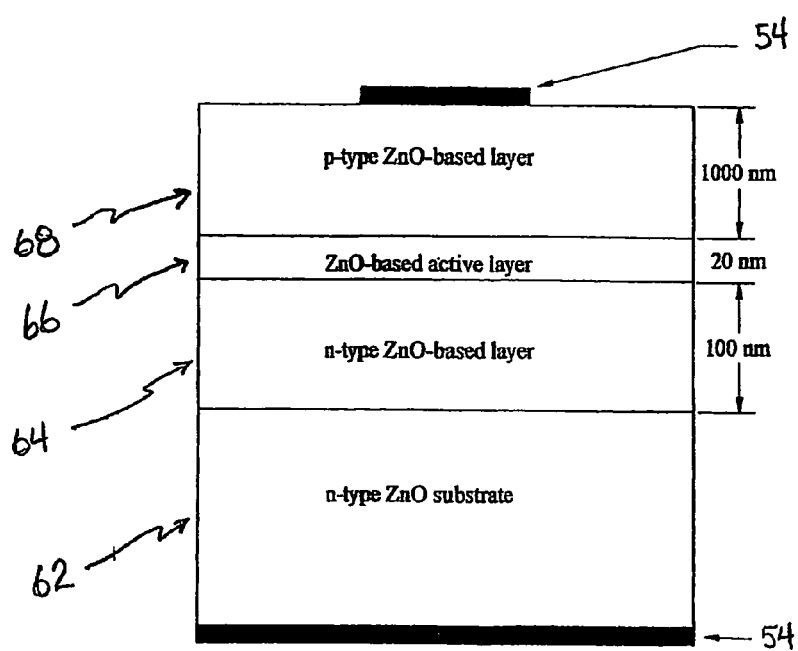
FIG. 10 is a schematic illustration of a light-emitting semiconductor device fabricated using the HBD system of FIG. 1 and an HBD method according to the present invention.

P-type ZnO:As thin film layers can be synthesized on SiC and ZnO substrates, preferably Si—SiC and O—ZnO, and more preferably on O—ZnO for the purpose of forming a variety of semiconductor devices, e.g., light-emitting diodes, laser diodes. The schematic for such a light emitting semiconductor device 60 fabricated according to a variant 300 of the HBD method 200 described above using the HBD system 10 is exemplarily depicted in FIG. 10. The exemplary light-emitting semiconductor device 60 is fabricated as a plurality of thin film layers that include a substrate layer 62 (for the described embodiment, an n-type ZnO substrate), an n-type ZnO based layer 64, a ZnO-based active layer 66, and a p-type ZnO based layer 68, with ohmic contacts 54 adhered to exposed surfaces (the major surfaces as depicted in FIG. 10) of the substrate layer 62 and the p-type ZnO-based layer 68. The carrier density in the n-type ZnO substrate 62 is within the range of about $1 \times 10^{16}$ to about $5 \times 10^{20}$ $cm^{-3}$, and preferably approximately $5 \times 10^{17}$ $cm^{-3}$. The target 30 for the embodiment of the HBD method 300 described herein is polycrystalline ZnO.

Figure 11:
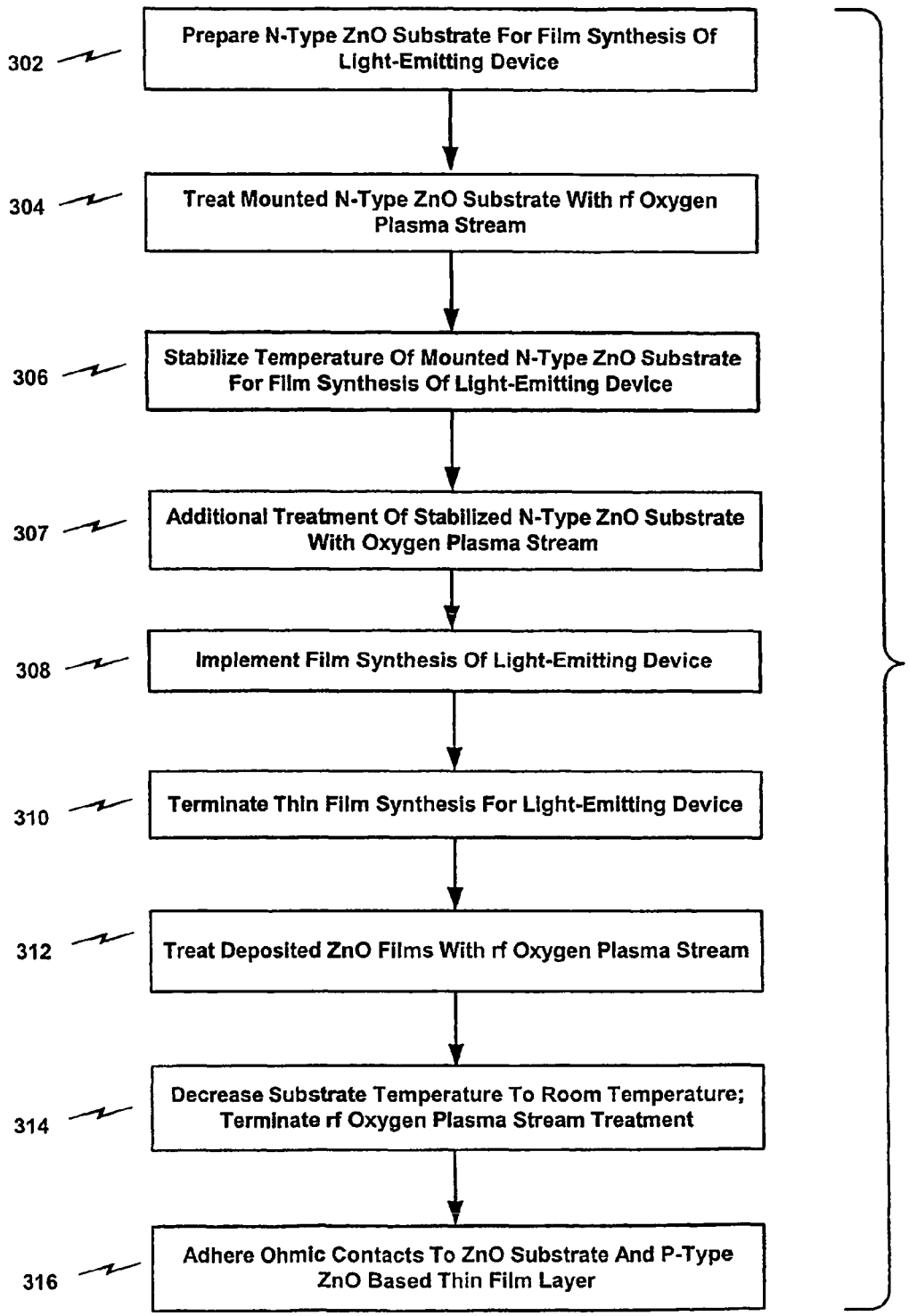
FIG. 11 illustrates an embodiment of an HBD method according to the present invention for synthesizing ZnO thin films using the HBD system of FIG. 1 for the light-emitting semiconductor device of FIG. 10.
Figure 11A:
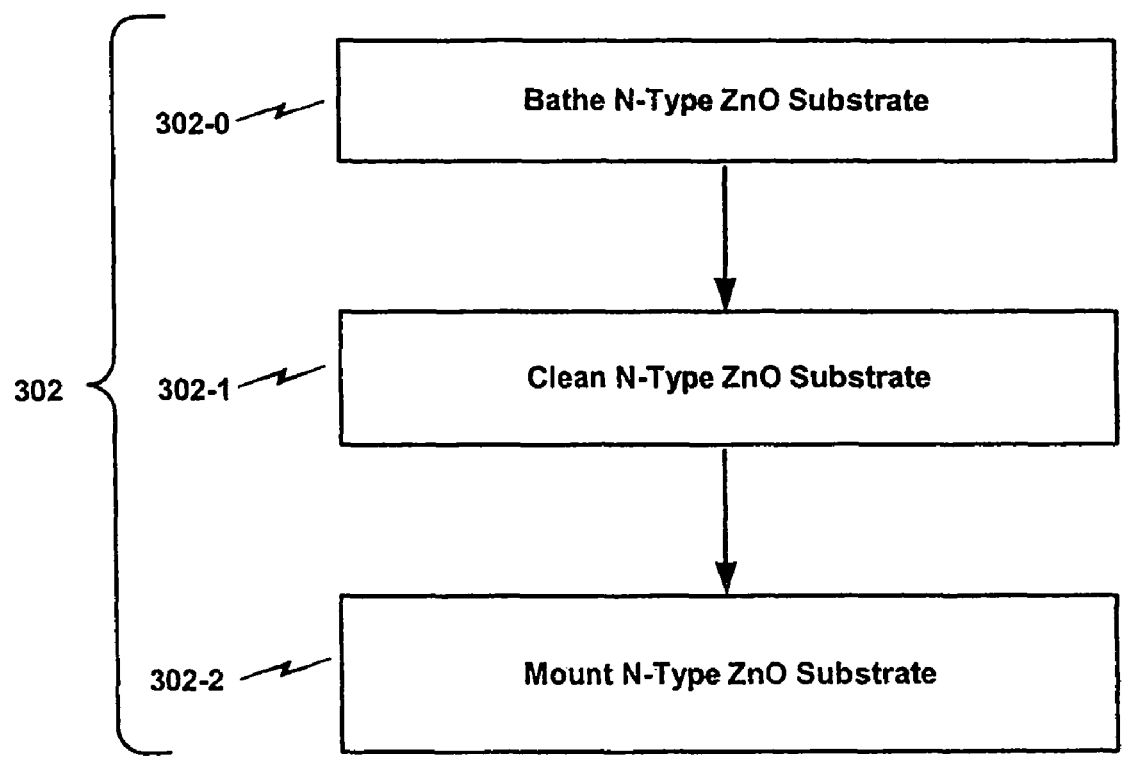
FIG. 11A illustrates three substeps for the step of preparing the substrate for thin film synthesis by the HBD method illustrated in FIG. 11.

Prior to implementing ZnO film synthesis, the n-type ZnO substrate layer 62 is prepared for synthesis in a first step 302 of the HBD method 300 (see FIGS. 11, 11A). As described above, this preparation step 302 can include a bathing substep 302-0 similar to that described above for HBD method 100A wherein the n-type ZnO substrate is bathed in one or more solvents selected from trichloroethanol, trichloroethylene, trichloromethane, trichloroethane, and trichloroacetic acid, preferably trichloroethane to smooth the substrate surface and promote high-quality thin film synthesis. The bathing substep 302-0 for an n-type ZnO substrate is performed for an interval within a range of about 1 minute to about 60 minutes, and preferably approximately 10 minutes, at a temperature within the range of about room temperature to about 200° C., and preferably approximately 70° C. Before completing substep 302-0, the substrate layer 62 is bathed with deionized pure water for a period within the range of about 1 minute to about 60 minutes, and preferably for approximately 10 minutes, at a temperature with the range of about room temperature to about 200° C., preferably approximately 70° C.

The n-type ZnO substrate layer 62 is then cleaned ultrasonically in a substep 302-1 first with pure acetone, then with methanol, and finally with deionized water at a temperature within the range of about room temperature to about 200° C., and preferably approximately 70° C., for a period of approximately 10 minutes. After this ultrasonic cleaning, the ZnO substrate layer 62 is bathed several times, preferably twice, with deionized pure water at a temperature within the range of about room temperature to about 200° C., and preferably at approximately 70° C., for a period of approximately 10 minutes to remove alcohol residues to complete substep 302-1. After these decontamination procedures, the ZnO substrate layer 62 is mounted in the deposition chamber 12 in a substep 302-2 to complete the preparation step 302.

In the deposition chamber 12, the deposition or synthesis surface of the mounted n-type ZnO substrate layer 62 is treated with rf-oxygen plasma generated by the rf reactive gas source 16 under predetermined conditions, i.e., treatment period, rf power level, and temperature and pressure levels, in a step 304. The rf oxygen plasma stream is directed onto the deposition surface of the mounted substrate layer 62 for a treatment period within the range of about 30 seconds to about 3 hours, and preferably for approximately 30 minutes. The predetermined temperature of the working environment within the deposition chamber 12 is maintained within the range of about 200° C. to about 2000° C., and preferably approximately 800° C. The rf reactive gas source is operated at a predetermined power level within the range of about 100 W to about 2000 W, and preferably at approximately 350 W. The dynamical pressure of rf oxygen plasma stream in the deposition chamber 12 is maintained within the range of about $1\times10^{-6}$ to about $1\times10^{-2}$ Torr, and preferably at $1\times10^{-5}$ Torr.

In step 306, the temperature of the n-type ZnO substrate layer 62 is stabilized at a predetermined synthesis temperature within the range of about 200° C. to about 1500° C., and preferably at approximately 650° C. Temperature changes in the mounted substrate layer 62 are effected at a predetermined rate within the range of about 1° C./min to about 100° C./min, and preferably at 20° C./min, to reach the predetermined synthesis temperature.

Once the temperature of the mounted substrate layer 62 is stabilized at the predetermined synthesis temperature in step 306, the stabilized substrate layer 62 is subjected to an additional treatment with the rf oxygen plasma stream under predetermined conditions, i.e., treatment period and predetermined dynamical pressure, in a step 307 (the mounted substrate layer 62 is maintained at the predetermined synthesis temperature achieved in step 306). The predetermined pressure of the oxygen plasma stream is within the range of about $1\times10^{-6}$ Torr to about $1\times10^{-2}$ Torr, and preferably approximately $1\times10^{-5}$ Torr. The predetermined treatment period is within the range of about 1 minute to about 2 hours, and preferably approximately 10 minutes.

The process for synthesizing the thin film layers comprising the light-emitting device 60 is implemented in step 308. To fabricate the light-emitting device 60 exemplarily illustrated in FIG. 10, a plurality of layers of ZnO and/or ZnO-based alloy thin films are deposited on the treated n-type ZnO substrate layer 62 in several substeps as illustrated in FIG. 11B (for the described embodiment of FIG. 10, a buffer or n-type ZnO thin film layer 64, a ZnO-based active layer 66, and a p-type ZnO thin film layer 68).

In a first substep 308A, the buffer ZnO film layer 64 is synthesized on the treated ZnO substrate layer 62 in several stages (see FIG. 11C) prior to synthesizing the p-type ZnO:As thin film layers. This undoped ZnO thin film may exhibit a slight intrinsic n-type conductivity due to the presence of oxygen vacancies in the synthesized ZnO thin film. In a first stage 308A-1, a ZnO thin film layer is deposited on the treated substrate layer 62 under predetermined conditions, i.e., rf oxygen plasma power, and oxygen pressure, and laser subsystem 22 operating parameters (the substrate layer 62 is maintained at the predetermined synthesis temperature attained in step 306 by operation of the oxygen resistant heater 26H). The rf oxygen gas source 16 is operated at a predetermined power level within the range of about 100 W to about 2000 W, and preferably at approximately 350 W. The oxygen pressure was maintained within the deposition chamber 12 at a predetermined pressure level within the range of about $1\times10^{-6}$ and $1\times10^{-2}$ Torr, and preferably at approximately $1\times10^{-5}$ Torr. The laser beam source 22S is operated at a pulse repetition rate within the range of about 1 Hz to about 5 kHz, and preferably approximately 10 Hz and with a pulse power within the range of about 10 mJ to about 1000 mJ, and preferably about 100 mJ, to generate a Zn, O plasma stream by pulsed laser ablation of the target 30. During laser ablation, the target 30 is rotated at a rate within the range of about 0.5 rpm to about 10 rpm, and preferably at 1 rpm. The deposition process of substep 308A is continued under these conditions until the buffer ZnO thin film layer 64 reaches a predetermined synthesis thickness within the range of about 1 nm to about 1000 nm, and preferably 100 nm. The measurement device 28 is monitored during the synthesis process of stage 308A-1 to identify the point when the buffer ZnO thin film layer 64 reaches the predetermined synthesis thickness.

Once the buffer ZnO thin film layer 64 reaches the predetermined thickness, laser ablation is temporarily suspended by deactivating the laser subsystem in stage 308A-2. The deposited buffer ZnO film layer 64 is then subjected to an rf oxygen plasma stream at predetermined conditions, i.e., predetermined treatment period at a higher predetermined pressure, in stage 308A-3. The predetermined treatment period is within the range of about 1 second to about 2 hours, and preferably approximately 20 minutes, and the rf oxygen plasma stream has a predetermined dynamical pressure within the range of about $1\times10^{-6}$ to about $1\times10^{-2}$ Torr, and preferably approximately $5\times10^{-5}$ Torr. The temperature of the n-type ZnO substrate layer 62 is then stabilized at the predetermined temperature for synthesis of p-type ZnO:As layers in stage 308A-4. The rate of change of the substrate layer 62 temperature was within the range of about 1° C./min to about 100° C./min, and preferably approximately 10° C./min. The predetermined synthesis temperature of the substrate layer 62 is within the range of about 200° C. to about 1500° C., and preferably approximately 550° C.

Once the predetermined synthesis temperature was achieved in stage 308A-4, the buffer ZnO thin film layer 64 is again subjected to an rf oxygen plasma stream treatment in stage 308A-5 for a treatment period within the range of about 1 second to about 60 minutes, and preferably for approximately 10 minutes (the dynamic oxygen pressure for stage 308A-5 is the same as that for stage 308A-3) to finalize the synthesis of the buffer ZnO film layer 64. After this treatment, the dynamic pressure of the oxygen plasma stream generated by the rf reactive gas source 16 is set to the predetermined synthesis pressure for p-type ZnO thin film synthesis to complete substep 308A. For the described embodiment, the predetermined synthesis pressure is within the range of about $1\times10^{-6}$ Torr to about $1\times10^{-2}$ Torr, and preferably approximately $1\times10^{-5}$ Torr.

Next, in substep 308B the ZnO-based active layer 66 is synthesized in several stages (see FIG. 11D) on the buffer ZnO thin film layer 64 synthesized in substep 308A. In stage 308B-1, the laser subsystem 22 is operated to generate the pulsed ArF excimer laser beam that is focused on the target 30, causing ablation thereof, to generate the high energy directional plasma plume Zn, O that is deposited on the buffer ZnO thin film layer 64. The laser subsystem 22 is operated under the predetermined synthesis conditions, i.e., pulse energy level and target rotational rate, described above in connection with step 108 of the HBD method 100. For stage 308B-1, the laser pulse rate is within the range of about 1 Hz to about 5 kHz, and preferably approximately 20 Hz.

In stage 308B-2, one or more sources of dopant material are activated for p-type ZnO:As layer growth, wherein the As-molecular beam used for doping was supplied by one or more of the combination of an injector, a cracker, or a Knudsen-type effusion cell, preferably here a Knudsen-type effusion cell 18A. The temperature of the As K-cell 18A is gradually increased to a predetermined synthesis temperature within the range of about 50° C. to about 400° C., and preferably between 120° C. and 200° C., at a predetermined rate within the range of about 1° C./min to about 100° C./min, and preferably approximately 30° C./min, after laser ablation had been resumed in stage 308B-1. The shutter of the As K-cell 18A is immediately opened at the moment the As K-cell 18A is stabilized at the predetermined synthesis temperature. Variation of the As element doping concentration is achieved by changing the predetermined synthesis temperature of the As K-cell 18A within the identified range described above which provides As-doping concentration levels within the range of about $1\times10^{16}$ cm$^{-3}$ to about $5\times10^{20}$ cm$^{-3}$, and preferably approximately $1\times10^{20}$ cm$^{-3}$. The second layer, identified as the ZnO-based active layer 66 in FIG. 10, is a heavily doped p-type ZnO:As thin film. The stage 308B process is continued until the ZnO-based thin film layer 66 reaches a predetermined thickness, which for the described embodiment is within the range of about 1 nm to about 1000 nm, preferably 20 nm. The measurement device 28 is monitored during stage 308B to identify the point at which the ZnO-based active layer 66 has attained the predetermined thickness, at which point stage 308B-2, and concomitantly, substep 308B, is complete.

Immediately following synthesis of the ZnO-based active layer 66 in step 308B, the synthesis of the p-type ZnO terminal thin film layer 68 is begun in substep 308C. The p-type ZnO film layer 68 can be characterized as a medium-doped p-type ZnO:As thin film. The predetermined conditions for synthesis of the p-type ZnO thin film layer 68 in substep 308C are the same as those described above in substep 308B, except for the As doping concentration levels and the predetermined thickness of the p-type ZnO film layer 68. The As-doping concentration level for the p-type ZnO film layer 68 is in the range of about $1\times10^{16}$ cm$^{-3}$ to about $5\times10^{20}$ cm$^{-3}$, and preferably approximately $5\times10^{18}$ cm$^{-3}$, while the predetermined thickness for the p-type ZnO thin film layer 68 is within the range of about 0.01 μm to about 100 μm, and preferably in the range of about 1 μm to about 1.5 μm.

When the total thickness of the three ZnO films synthesized in substeps 308A, 308B, and 308C have a value within the range of about 0.01 μm to about 100 μm, and preferably approximately 1 μm, the synthesis of the ZnO thin films comprising the light-emitting semiconductor device 60, i.e., step 308, is complete.

In step 310, the process of synthesizing thin films to fabricate the light-emitting device 60 is terminated in two substeps 310A and 310B (see FIG. 11E). In step 310A the laser subsystem 22 is deactivated. In step 310B, the temperature of the K-cell 18A is decreased to room temperature at a predetermined rate wherein the predetermined rate is within the range of about 1° C./min to about 400° C./min, and preferably about 100° C./min.

In step 312, the ZnO thin film layers synthesized in step 308 are treated with the rf oxygen plasma stream generated by the rf reactive gas source 16 for a predetermined treatment period and a higher predetermined dynamical pressure while the substrate 32 is maintained at the predetermine synthesis temperature established in step 308A-4. For the described embodiment, the predetermined dynamical pressure of the rf oxygen plasma stream is within the range of about $1\times10^{-6}$ Torr to about $1\times10^{-2}$ Torr, and preferably approximately $5\times10^{-5}$ Torr while the predetermined treatment period is within the range of about 1 second to about 10 hours, and preferably approximately 10 minutes.

After the predetermined treatment period has expired, i.e., step 312 is complete, the temperature of the n-type ZnO substrate layer 62 is decreased to room temperature at a predetermined rate in step 314. The predetermined rate for the substrate layer 62 temperature decrease is within the range of about 1° C./min to about 100° C./min, preferably 10° C./min.

Once the substrate layer 62 temperature is stabilized at room temperature, the rf oxygen plasma stream is terminated by deactivating the rf reactive gas source 16 to complete step 314.

To complete the fabrication of a light-emitting semiconductor device 60 of the type exemplarily illustrated in FIG. 10, ohmic contacts 54 are adhered to the ZnO substrate 62 and the p-type ZnO-based thin film layer 68 in a step 316. The p-type ZnO-based thin film layer 68 is patterned and then etched with dilute (10%) hydrochloric acid to form a 5×800 μm$^2$ mesa surface pattern on its major surface. For the ohmic contact electrode on the p-type ZnO:As layer 68, the metallic contact 54 adhered to the major surface of the mesa has the bilayered configuration described above comprised of Ni and Au in an area of about 300×300 μm$^2$. For the ohmic contact electrode on the n-type ZnO substrate 62, the metal contact 54 has the bilayered configuration comprised of In and Au and was formed on the entire bottom face of the n-type ZnO substrate 62.

Figure 12:
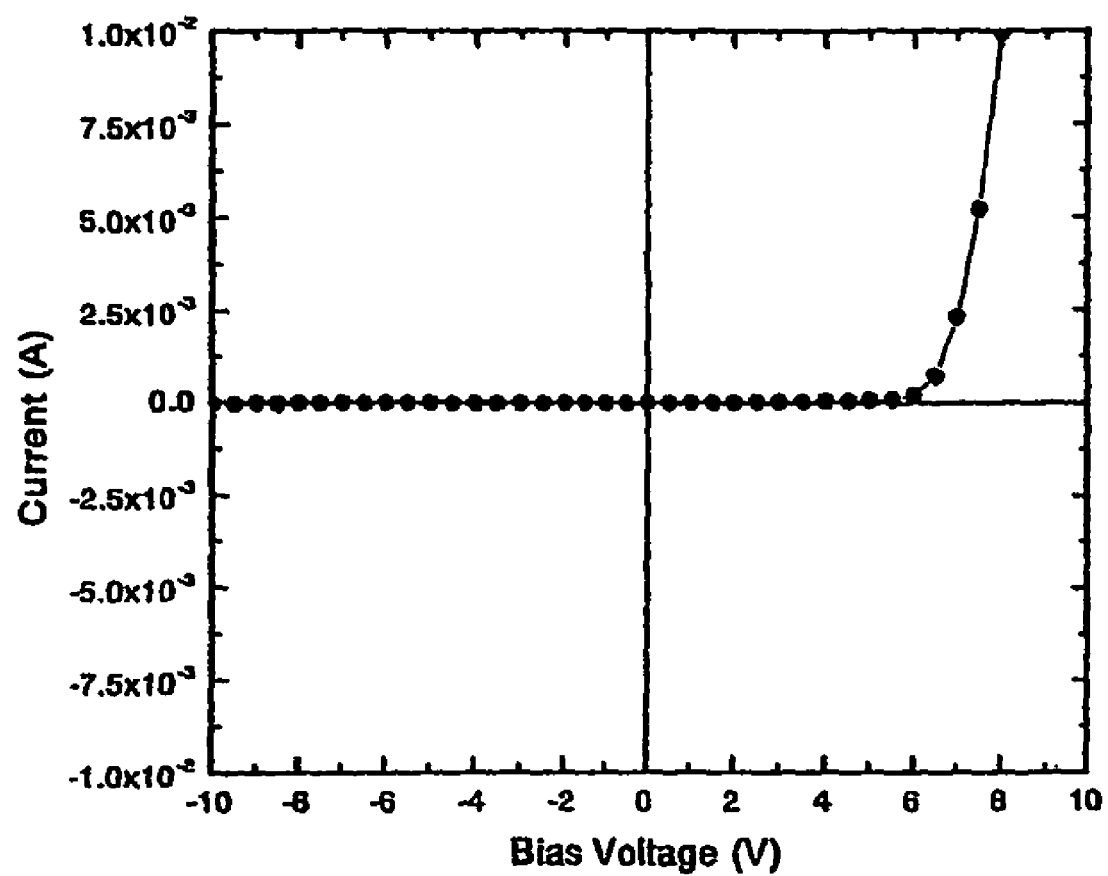
FIG. 12 illustrates the I-V characteristics of a ZnO-based light-emitting semiconductor device synthesized using the HBD method of FIG. 11.
Figure 13A:
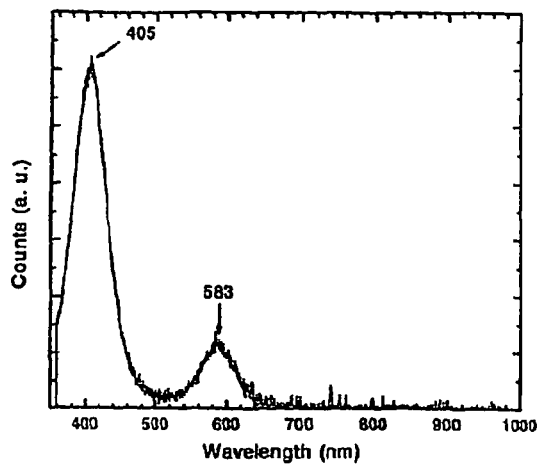
FIG. 13A illustrates the PL spectra at room temperature of the ZnO-based light emitting semiconductor device of FIG. 12.
Figure 13B:
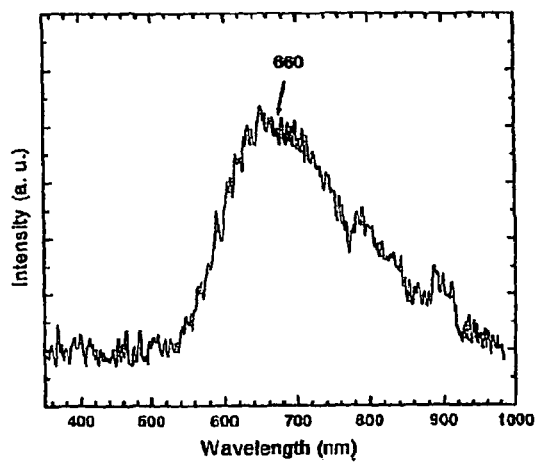
FIGS. 13B, 13C illustrate the EL spectra at room temperature of the ZnO-based light-emitting semiconductor device of FIG. 12.
Figure 13C:
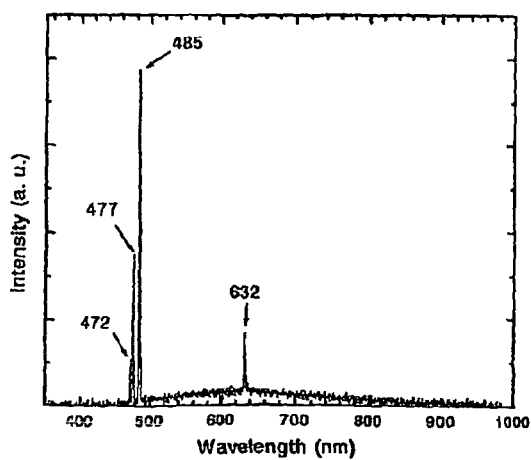

The light-emitting semiconductor device 60 fabricated using the HBD method 300 and HBD system 10 described above exhibits the rectifying characteristics of a p-n junction, as shown in FIG. 12. DC electroluminescence (EL) spectra were measured at room temperature (RT) on the semiconductor device 60. The emission mechanism changes as a function of injected current; from spontaneous emission to stimulated emission (lasing), as shown in FIGS. 13B, 13C. At low values of injected current density, for example at 0.7 kA/cm$^2$, radiation from the device is dominated by very broad emission peaks located near 660 nm, as shown in FIG. 13B. Such emission is spontaneous, and is associated with deep energy levels in the ZnO-based active layer 66. FIG. 13A is the PL spectra measured at room temperature on the semiconductor device 60. The difference in peak location (~77 nm) between the PL spectra (FIG. 13A) and the EL spectra (FIG. 13B) may arise from Stark and thermal effects. When the injected current density is increased to 1.1 kA/cm$^2$, several sharp peaks appear, as shown in FIG. 13C. The radiation mechanism associated with these peaks is stimulated emission. Taking into account the peak shift of approximately 77 nm between peak positions in the PL and EL spectra, and noting the peak positions of the PL spectra shown in FIGS. 9A-9C, it is reasonable to associate the peaks at 472, 477, and 485 nm with the exciton-related emission lines.

A ZnO-based homojunction laser diode 60 fabricated utilizing the HBD method 300 and system 10 according to the present invention generates stimulated emission at room temperature in response to current injection. Radiation is confined to the ZnO-based active layer 66 in such a homojunction laser due to the difference in refractive index arising from the difference in carrier concentrations in the p-type ZnO layers, i.e., the ZnO-based active layer 66 and the p-type ZnO thin film layer 68 of the described embodiment of the light-emitting semiconductor device 60.

Figure 14:
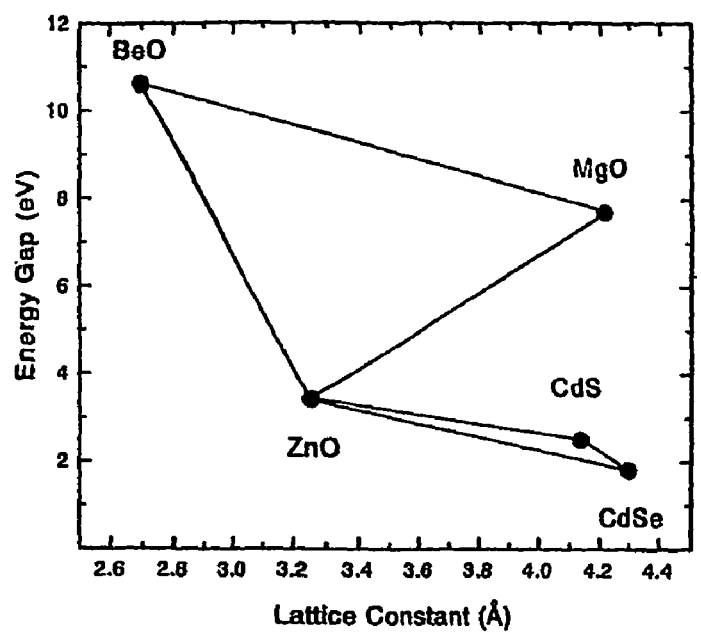
FIG. 14 illustrates the energy band gap of selected group II-VI compounds in terms of lattice constants.

It may be desirable to be able to modulate the value for the energy band gap of ZnO in order to use ZnO based semiconductor devices in the range of UV to visible wavelength, and also to be able to increase radiation efficiencies for such semiconductor devices. A suitable approach to modifying the value of the band gap is to alloy ZnO with one or more other materials selected from the II-VI binary compounds BeO, MgO, CaO, SrO, BaO, CdO, HgO, ZnS, ZnSe, ZnTe, CdTe, CdS, CdSe, MgS, MgSe, and MgTe, preferably one or more II-VI binary compounds selected from BeO, CdS, CdSe which have the same crystal structure as the ZnO structure and which are shown in FIG. 14. To obtain a material with a wider band gap than that of ZnO, ZnO can be mixed with one or more selected materials selected from the group of materials consisting of BeO, MgO, CaO, SrO, and BaO, preferably from the group of materials consisting of BeO, MgO, and more preferably BeO.

In consideration of Vernard's Law, ZnO can be mixed with BeO in a proper ratio to attain a particular band gap value; for example, the energy band gap of $Zn_{0.95}Be_{0.05}O$ is greater by 0.36 eV than that of ZnO. When ZnO is alloyed with BeO, a very small amount of Mg can be added to help alleviate crystalline stress and associated crystalline defects that are created due to the difference in lattice constants between ZnO and BeO without significantly changing the value of the band gap energy.

To obtain materials that have an energy band gap that is smaller in value than the band gap of ZnO, ZnO can be mixed with one or more materials selected from the group consisting of CdO, HgO, CdS, CdSe, ZnSe, and ZnTe, and preferably from the group of materials consisting of CdO, CdSe, and CdS. By use of quaternary compounds such as $Zn_xCd_{1-x}O_{1-y}Se_y$ or $Zn_xCd_{1-x}O_{1-y}S_y$, the band gap of ZnO can be modified to be in the range from 3.4 to 1.8 eV, or from 3.4 to 2.5 eV, respectively.

To achieve high radiation efficiencies, the ZnBeO ternary can be used in a ZnO-based semiconductor device as a cladding layer for confinement in lieu of the first and third layers, i.e., the n-type ZnO-base layer 64 and the p-type ZnO-based layer 68 depicted in FIG. 10, and a quaternary of ZnCdOSe or ZnCdOS, preferably ZnCdOSe, as the active layer to obtain emissions at variable wavelengths, i.e., in lieu of the p-type ZnO-based active layer 66 depicted in FIG. 10. The output power of such a light-emitting device can be increased by using four double-heterojunction structures as cladding/confining layers consisting of at least two different ZnO-based alloy layers having different energy band gaps, instead of using ZnO-based layers for the first and third layers 64, 68 depicted in FIG. 10. Using a multi-quantum-well structure as an active layer, rather than the simple ZnO-based thick active layer 66 shown in FIG. 10, can also improve the efficiency of the device output power. These high-efficiency devices can be fabricated using ZnO, ZnBeO, and ZnCdOSe or ZnCdOS.

Figure 15:
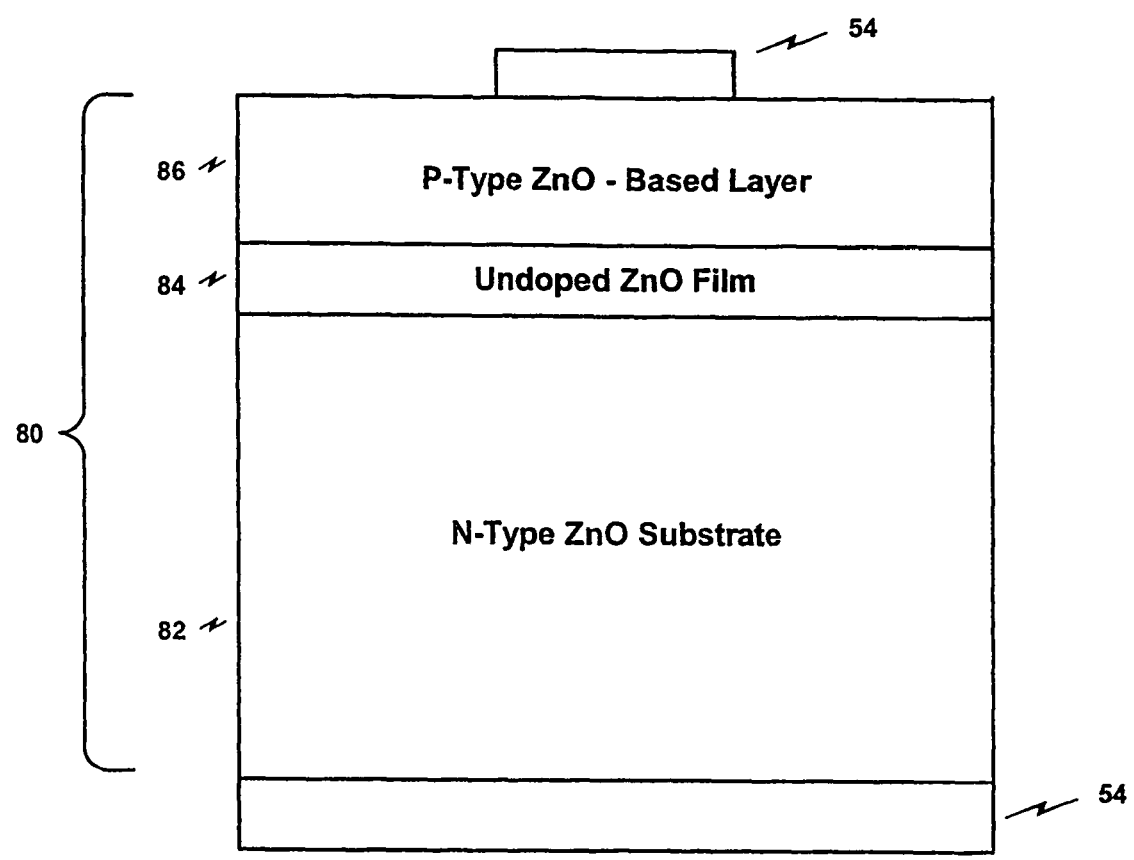
FIG. 15 is a schematic illustration of a photodetection semiconductor device fabricated using the HBD system of FIG. 1 and an HBD method according to the present invention.

Another application for ZnO-based II-VI compounds is in photodetection applications. A prototype of a p-n junction-type photodetector device 80, as illustrated in FIG. 15, is synthesized using an HBD method 400 and the HBD system 10 according to the present invention The p-n junction-type photodetector device 80 comprises a substrate layer 82 (for the described embodiment an n-type ZnO substrate), an undoped ZnO film 84, and a p-type ZnO-based thin film layer 86. The p-n junction-type photodetector device 80 can be synthesized as a p-n junction with very light-doped ZnO:As thin film layers deposited on an n-type SiC or n-type ZnO substrate, preferably n-type Si—SiC and n-type O—ZnO substrates, and more preferably a substrate having an n-type O—ZnO layer onto which thin films are deposited. The carrier density in the n-type ZnO substrate is in range of about $1 \times 10^{16}$ cm$^{-3}$ to about $5 \times 10^{20}$ cm$^{-3}$, and preferably approximately $5 \times 10^{17}$ cm$^{-3}$. The target 30 for the embodiment of the HBD method 400 described herein is polycrystalline ZnO.

Figure 16:
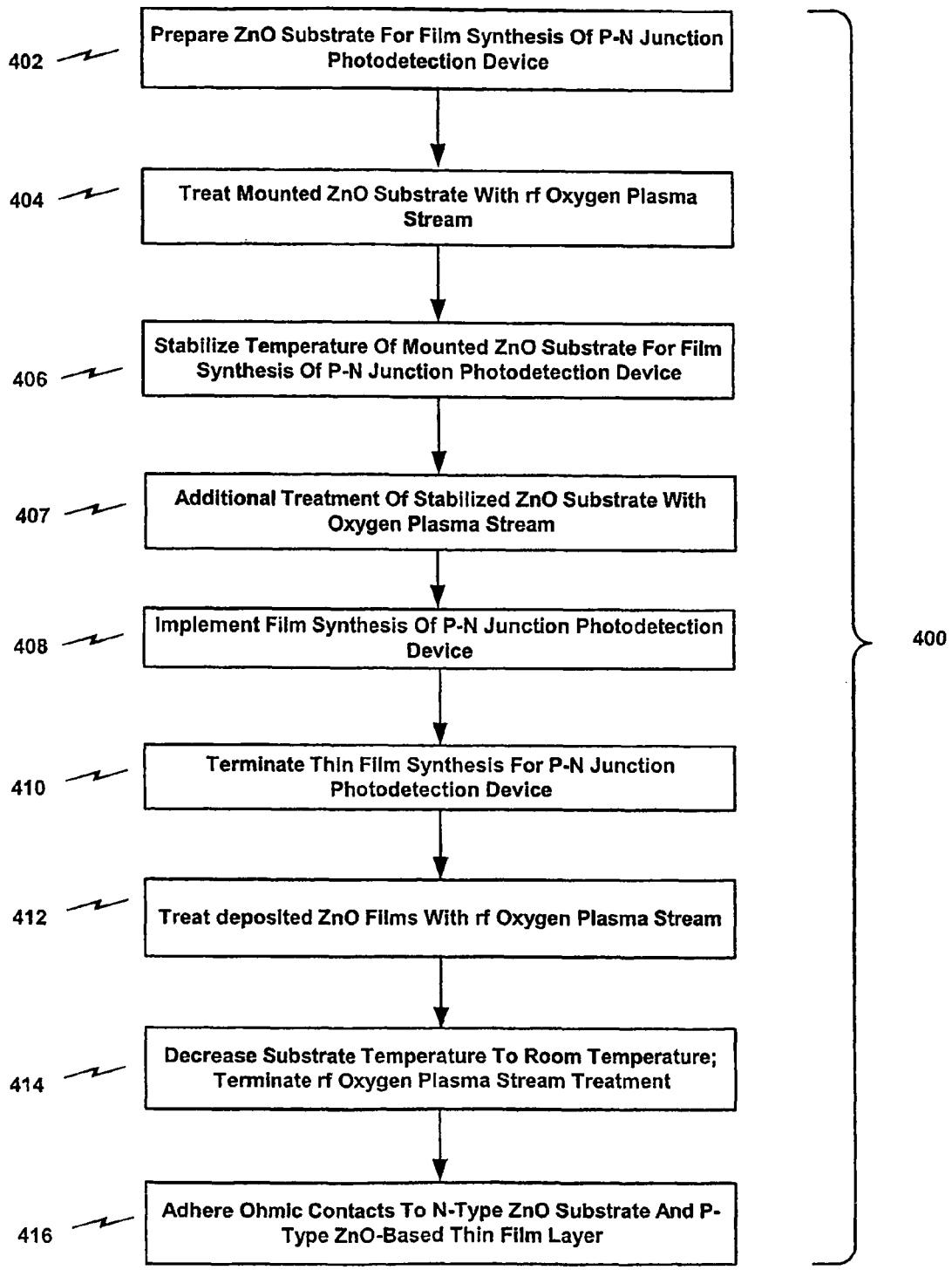
FIG. 16 illustrates an embodiment of an HBD method according to the present invention for synthesizing ZnO thin films using the HBD system of FIG. 1 for p-n junction-type photodetection semiconductor devices.
Figure 16A:
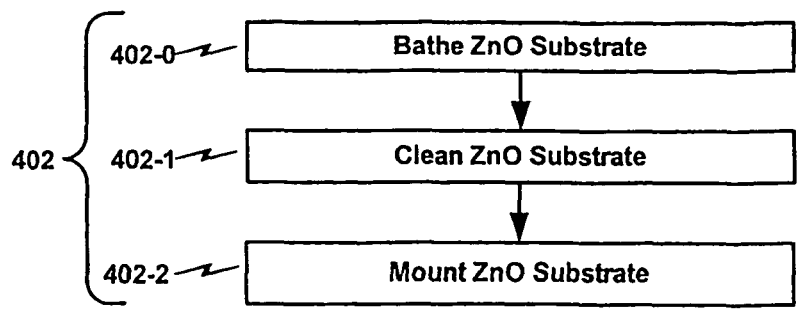
FIG. 16A illustrates three substeps for the step of preparing the substrate for thin film synthesis by the HBD method illustrated in FIG. 16.

Prior to synthesis of ZnO thin film layers, the ZnO substrate 82 is prepared for synthesis in a step 402 as illustrated in FIGS. 16, 16A. As described hereinabove, this preparation step 402 can include a bathing substep 402-0 that is the same as substep 102A-0 described above wherein the ZnO substrate 82 is bathed in a solution containing one or more of the solvents trichloroethanol, trichloroethylene, trichloromethane, trichloroethane, and trichloroacetic acid, and preferably trichloroethane, to smooth the substrate 82 surface and promote high-quality film growth The bathing substep 402-0 for a ZnO substrate 82 is performed for a period within the range of about 1 minute to about 60 minutes, and preferably for 10 minutes, at a temperature within the range of about room temperature to about 200° C., and preferably at approximately 70° C. After solvent cleaning, the substrate 82 is bathed with deionized pure water for a period within the range of about 1 minute to about 60 minutes, and preferably for approximately 10 minutes, at a temperature within the range of about room temperature to about 200° C., and preferably approximately 70° C.

The ZnO substrate 82 is then cleaned ultrasonically in a substep 402-1 first with pure acetone, then with methanol, and finally with deionized water at a temperature within the range of about room temperature to about 200° C., and preferably at approximately 70° C., for a period of about 10 minutes. After this ultrasonic cleaning, the ZnO substrate 82 is bathed several times, preferably twice, with deionized pure water at a temperature within the range of about room temperature to about 200° C., and preferably at approximately 70° C., for a period of approximately 10 minutes to remove alcohol residues to complete substep 402-1. After these decontamination procedures, the ZnO substrate 82 is mounted in the deposition chamber 12 in a substep 402-2 to complete the preparation step 402.

In the deposition chamber 12, the deposition surface of the mounted substrate 82 is treated by the rf-oxygen plasma source generated by the rf reactive gas source 16 under predetermined conditions, i.e., treatment period, rf power level, and temperature and pressure levels, in a step 404. The rf oxygen plasma stream is directed onto the deposition surface of the mounted substrate 82 for a treatment period within the range of about 30 seconds to about 3 hours, and preferably for approximately 30 minutes. The predetermined temperature of the working environment within the deposition chamber 12 is within the range of about 200° C. to about 2000° C., and preferably approximately 800° C. The rf reactive gas source 16 is operated at a predetermined power level within the range of about 100 W to about 2000 W, and preferably at 350 W. The dynamical pressure of rf oxygen plasma stream in the deposition chamber 12 is maintained within the range of about $1 \times 10^{-6}$ Torr to about $1 \times 10^{-2}$ Torr, and preferably at $1 \times 10^{-5}$ Torr.

In step 406 the temperature of the substrate 82 is stabilized at a predetermined synthesis temperature within the range of about 200° C. to about 1500° C., and preferably at approximately 650° C. Temperature changes in the mounted substrate 82 are effected at a predetermined rate within the range of about 1° C./min to about 100° C./min, and preferably at approximately 20° C./min, to reach the predetermined synthesis temperature.

Once the temperature of the mounted substrate 82 is stabilized at the predetermined synthesis temperature in step 406, the stabilized substrate 82 is subjected to an additional treatment with the rf oxygen plasma stream under predetermined conditions, i.e., treatment period and predetermined pressure, in a step 407. The predetermined pressure of the rf oxygen plasma stream is within the range of about $1 \times 10^{-6}$ Torr to about $1 \times 10^{-2}$ Torr, and preferably approximately $2 \times 10^{-5}$ Torr. The predetermined treatment period is within the range of about 1 second to about 2 hours, and preferably approximately 10 minutes.

Figure 16B:
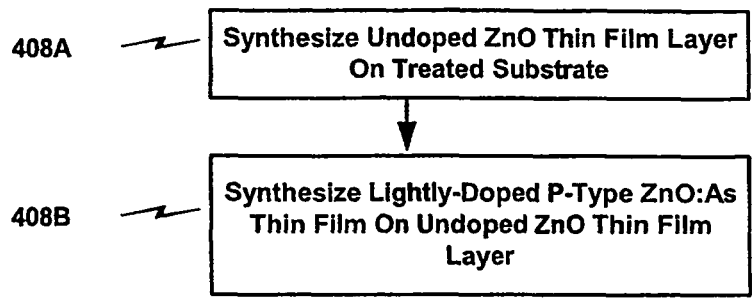
FIG. 16D illustrates the film synthesis substeps for the photodetection semiconductor device of FIG. 15 using the HBD method of FIG. 16.
FIG. 16C illustrates the process stages for synthesizing an undoped ZnO thin film layer as one of the synthesis substeps of FIG. 16B.
FIG. 16E illustrates the substeps for terminating the synthesis process of the HBD method of FIG. 16.
Figure 16C:
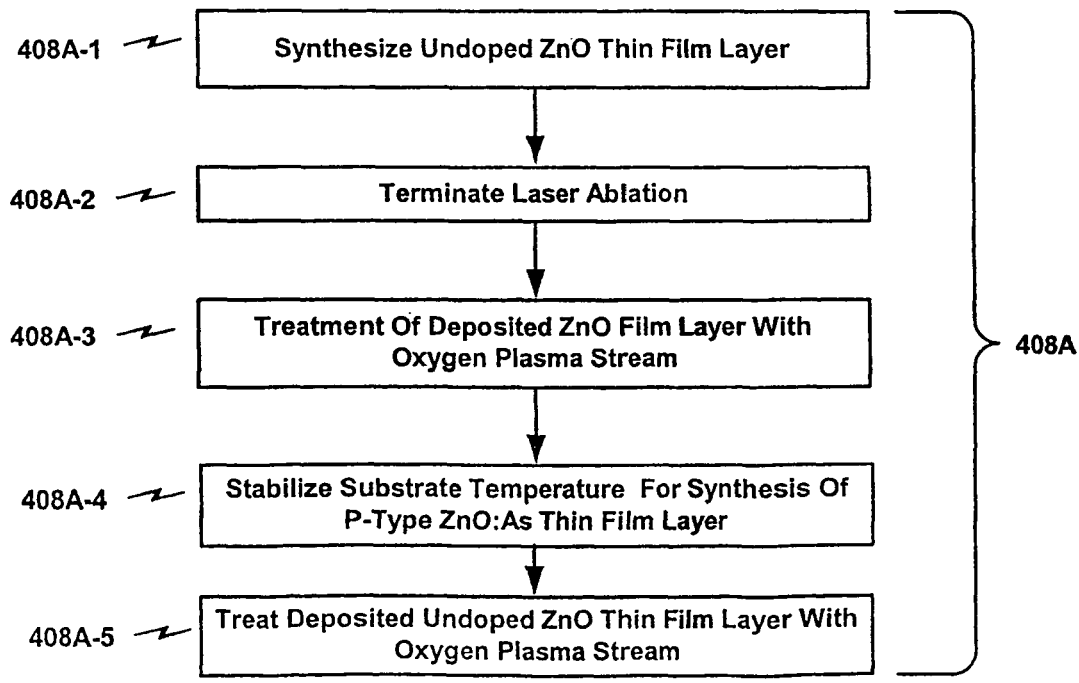

The process for synthesizing the thin films comprising the p-n junction-type photodetector device 80 is implemented in step 408. To fabricate the p-n junction-type photodetector device 80 depicted in FIG. 15, two thin film layers of ZnO are deposited on the treated substrate 82 in two substeps as illustrated in FIG. 16B (for the described embodiment of FIG. 15, an undoped ZnO thin film layer 84 and a p-type ZnO-based thin film layer 86).

In a first substep 408A, the undoped ZnO thin film layer 84 is synthesized (deposited) on the treated substrate 82 prior to synthesizing the p-type ZnO:As thin film layer 86 in several stages (see FIG. 11C). In stage 408A-1, an undoped ZnO thin film layer is deposited on the treated substrate 32 under predetermined synthesis conditions, i.e., rf oxygen plasma power and oxygen pressure and laser subsystem 22 operating conditions (the treated substrate 32 is maintained at the predetermined synthesis temperature, i.e., stabilized temperature, attained in step 406). The dynamical pressure of the rf oxygen plasma stream is maintained at the pressure level attained in step 407. The rf oxygen gas source 16 is operated at the predetermined power level of about 100 W to about 2000 W, and preferably at approximately 350 W (see step 404). The laser beam source 22S is operated at a pulse repetition rate within the range of about 1 Hz to about 5 kHz, and preferably approximately 10 Hz and at a pulse power within the range of about 10 mJ to about 1000 mJ, and preferably about 100 mJ, to generate a Zn, O plasma stream by pulsed laser ablation of the target 30. During laser ablation, the target 30 is rotated at a rate within the range of about 0.5 rpm to about 10 rpm, and preferably at 1 rpm. The deposition stage 408A-1 of substep 408A is continued under these conditions until the undoped ZnO film layer 84 reaches a predetermined thickness within the range of about 1 nm to about 1000 nm, and preferably 20 nm. The measurement device 28 is monitored during the deposition stage 408A-1 to determine when the undoped ZnO thin film layer 84 attains the predetermined synthesis thickness.

Once the undoped ZnO thin film layer 84 reaches the predetermined synthesis thickness, laser ablation is temporarily suspended by deactivating the laser subsystem 22 in stage 408A-2. The deposited undoped ZnO thin film layer 84 is then subjected to the rf oxygen plasma stream at predetermined conditions, i.e., predetermined treatment period at a higher predetermined pressure, in stage 408A-3. The predetermined treatment period is within the range of about 1 second to about 2 hours, and preferably approximately 20 minutes, and the rf oxygen plasma stream has a predetermined dynamical pressure within the range of about $1 \times 10^{-6}$ Torr to about $1 \times 10^{-2}$ Torr, and preferably approximately $5 \times 10^{-5}$ Torr.

Upon expiration of the predetermined treatment period, the substrate 82 temperature is then stabilized at the predetermined temperature for synthesis of p-type ZnO:As thin films in stage 408A-4. The rate of change of the substrate 82 temperature was within the range of about 1° C./min to about 100° C./min, and preferably approximately 10° C./min for stage 408A-4. The predetermined synthesis temperature of the substrate 82 for stage 408A-4 was within the range of about 200° C. to about 1500° C., and preferably approximately 550° C.

Once the substrate 82 is stabilized at the predetermined synthesis temperature in stage 408A-4, the undoped ZnO thin film layer is again treated with an oxygen plasma stream in stage 408A-5 for a treatment period within the range of about 1 second to about 60 minutes, and preferably for approximately 10 minutes (the dynamical pressure for stage 408A-5 is the same as that for stage 408A-3) to complete the synthesis of the undoped ZnO thin film layer 84 of the p-n junction-type photodetector device 80.

Figure 16D:
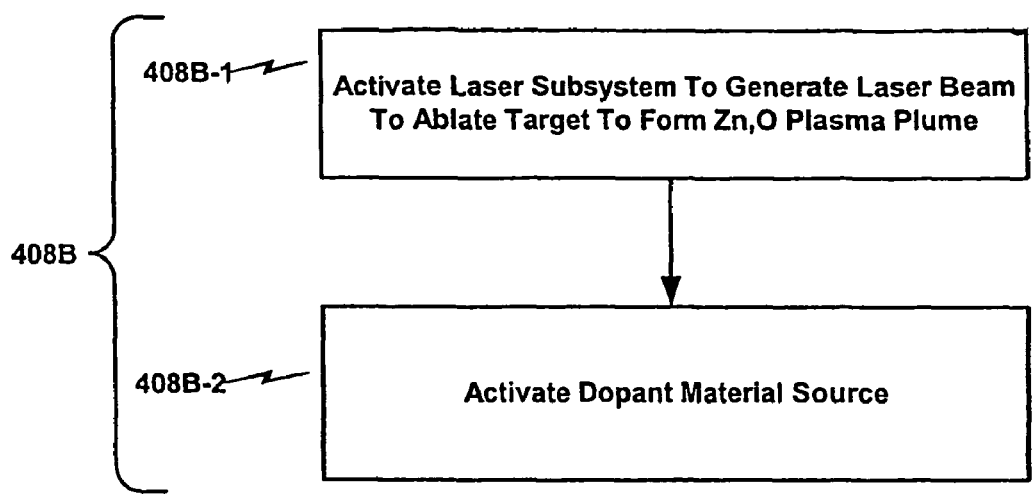

Next, in substep 408B the p-type ZnO:As thin film layer 86 is synthesized in several stages (see FIG. 16D) on the undoped ZnO thin film layer 84 synthesized in step 408A. For the described embodiment, the predetermined dynamical pressure of the rf oxygen plasma stream for step 408B is maintained within the range of about $1 \times 10^{-6}$ Torr to about $1 \times 10^{-2}$ Torr, and preferably, approximately $1 \times 10^{-5}$ Torr. In stage 408B-1, the laser subsystem 22 is operated to generate the pulsed ArF excimer laser beam that is focused on the target 30, causing ablation thereof, to generate the high energy directional plasma plume of Zn, O that is deposited on the undoped ZnO thin film layer 84. The laser subsystem 22 is operated under the predetermined synthesis conditions, i.e., pulse energy level and target rotational rate, described above in connection with step 108 of the HBD method 100 described above. For stage 408B-1, the laser pulse rate is within the range of about 1 Hz to about 5 kHz, and preferably 20 Hz.

In stage 408B-2, one or more sources of dopant material, i.e., subsystems 18 and/or 20, are activated for p-type ZnO:As thin film layer synthesis, wherein the As-molecular beam used for doping is supplied by one or more selected sources selected from an injector, a cracker, or a Knudsen-type effusion cell, preferably here a Knudsen-type effusion cell 18A. The temperature of the As K-cell 18A is gradually increased to a predetermined synthesis temperature at a rate within the range of about 1° C./min to about 100° C./min, and preferably approximately 30° C./min. The shutter of the As K-cell 18A is immediately opened when the As K-cell 18A stabilized at a predetermined synthesis temperature within the range 50° C. to 400° C., and preferably within the range of about 120° C. to about 200° C. Variation of the As element doping concentration is achieved by changing the predetermined synthesis temperature of the As K-cell 18A with the identified range described above which provides As-doping concentration levels within the range of about $1 \times 10^{15}$ cm$^{-3}$ to about $1 \times 10^{18}$ cm$^{-3}$, and preferably approximately $1 \times 10^{16}$ cm$^{-3}$. The synthesis conditions of stage 408B-2 are continued until the lightly-doped p-type ZnO:As thin film layer 86 reaches a predetermined thickness in the range of about 0.01 μm to about 100 μm and preferably about 1 μm, at which time stage 408B-2 (and substep 408B) is complete.

Figure 16E:
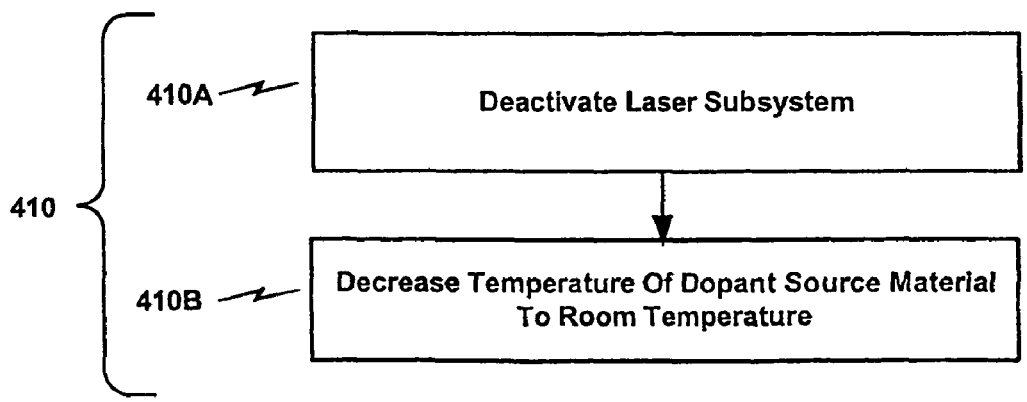

In step 410, the process of synthesizing ZnO thin film layers for the p-n junction-type photodetector device 80 is terminated (see FIG. 16E). In step 410A, the laser subsystem 22 is deactivated. In step 410B, the temperature of the As K-cell 18A is decreased to room temperature at a predetermined rate within the range of about 1° C./min to about 400° C./min, and preferably 100° C./min.

Once the As K-cell 18A is stabilized at room temperature, the ZnO thin film layers 84, 86 synthesized in step 408B are treated with the rf oxygen plasma stream generated by the rf reactive gas source 16 in step 412 (without changing the substrate 32 temperature from the predetermined synthesis temperature of stage 408A-4) for a predetermined treatment period and at a higher predetermined dynamical pressure. For the described embodiment, the predetermined dynamical pressure of the rf oxygen plasma stream is within the range of about $1 \times 10^{-6}$ Torr to about $1 \times 10^{-2}$ Torr, and preferably $5 \times 10^{-5}$ Torr, while the predetermined treatment period is within the range of about 1 second to about 10 hours, and preferably approximately 10 minutes.

After completion of the predetermined treatment period in step 412, the substrate 82 temperature is decreased to room temperature at a predetermined rate in step 414. This predetermined rate is within the range of about 1° C./min to about 100° C./min, and preferably approximately 10° C./min. Once the substrate 82 temperature is stabilized at room temperature, the rf oxygen plasma stream is terminated by deactivating the rf reactive gas source 16 to complete step 414.

To complete the fabrication of the p-n junction-type photodetection device 80 of the type exemplarily illustrated in FIG. 15, ohmic contacts are adhered to the n-type ZnO substrate 82 and the p-type ZnO-based thin film layer 86 in step 416. The p-type ZnO:As thin film layer 86 is patterned and then etched with dilute (10%) hydrochloric acid to form a 500×800 μm² mesa surface pattern on its major surface. For the ohmic contact electrode on the p-type ZnO:As thin film layer 86, the metallic contact 54 adhered to the major surface of the mesa has the bilayer configuration described above comprised of Ni and Au in an area of about 300×300 μm². For the ohmic contact on the n-type ZnO substrate 82, the metallic contact 54 has the bilayer configuration comprised of In and Au, which was formed on the entire bottom face of the n-type ZnO substrate 82.

Figure 17:
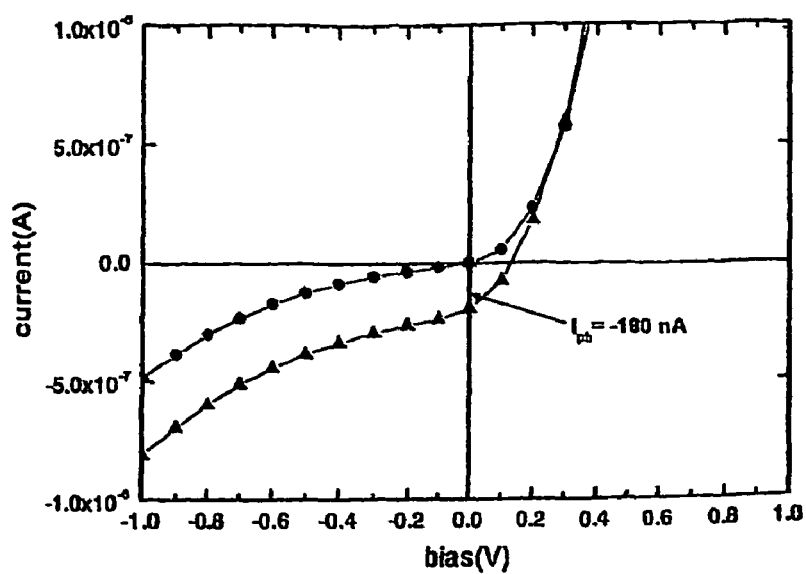
FIG. 17 illustrates the photoresponse curve of a ZnO-based photodetection semiconductor device fabricated using the HBD method of FIG. 16.
Figure 18:
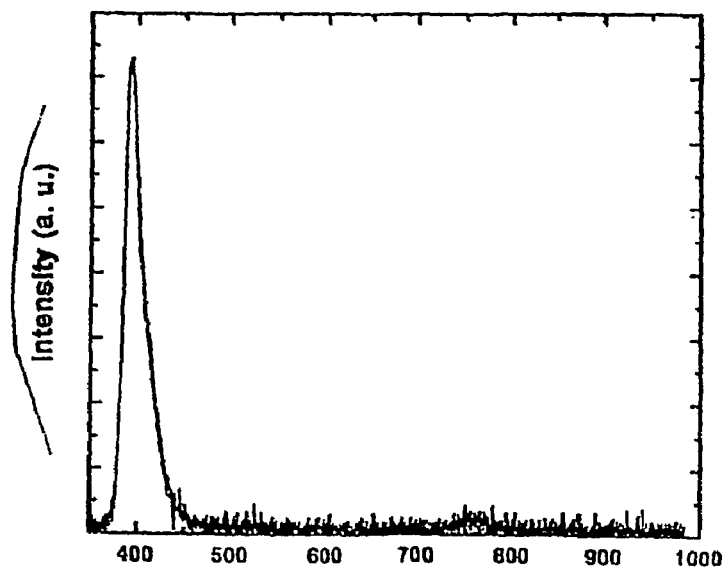
FIG. 18 illustrates the PL spectrum of a ZnO-based photodetection semiconductor device fabricated using the HBD method of FIG. 16.

A halogen lamp which emitted radiation from the UV (350 nm) to IR (1.1 μm) was used as an external photon source to determined the detection capability of the p-n junction-type photodetector device 80 illustrated in FIG. 15, as fabricated by the HBD method 400 and HBD system 10 described above. This p-n junction-type photodetector device 80 showed very strong photo-current signals in response to emission from this halogen lamp as illustrated in FIG. 17. This p-n junction-type photodetector device 80 was characterized at room temperature by PL spectroscopy to determine its wavelength response. The PL spectra had dominant peaks only in the spectral region near 390 nm, as shown in FIG. 18. The PL results indicate that the ZnO-based p-n junction-type photodetector device 80 described above is effective in detecting light with wavelengths near 390 nm or smaller.

The above-described HBD method 400 can be utilized to fabricate photodetectors using alloy compounds to cover the broad wavelength range from about 689 nm to about 117 nm since it is theoretically possible to modulate the energy band gap of ZnO-based II-VI compounds down to 1.8 eV using CdSe, to 3.4 eV for ZnO, and upward to 10.6 eV using BeO.

The HBD methods 300, 400 of the present invention, using the HBD system 10 according to the present invention, described above can be used to fabricate a wide variety of semiconductor devices such as LEDs, LDs, photodetectors, gas sensors, and bipolar/unipolar semiconductor devices such as HBTs and FETs. It will be appreciated that the description of these methods 300, 400 as described above in terms of specific semiconductor devices, e.g., the light-emitting semiconductor device 60 and the photodetector device 80, respectively, is not intended to limit the scope of these methods.

It will further be appreciated that the description of these methods in terms of film "layers" was likewise not intended to be limiting. One skilled in the art will appreciate that the methods of the present invention can be used to synthesize discrete and discontinuous films having a wide variety of geometric configurations/structures, e.g., islands or wells, on any synthesis surface (or previously-synthesized film "layer"), and that subsequent thin films can be synthesized adjacent to and/or onto such geometric film structures. The use of the terminology "layer" in these descriptions was only for the purpose of simplifying such descriptions.

A variety of modifications and variations of the present invention are possible in light of the above teachings. For example, It is therefore to be understood that, within the scope of the appended claims, the present invention may be practiced other than as specifically described herein.

What is claimed is:

1. A hybrid beam deposition method for synthesizing doped metal oxide and metal-based oxide alloy films, comprising the steps of:

(a) preparing a substrate having a synthesis surface for film synthesis;
(b) treating the substrate by directing a first rf oxygen plasma stream at the synthesis surface of the substrate under predetermined treatment conditions that include a predetermined dynamical pressure for the rf oxygen plasma stream;
(c) stabilizing the substrate at a predetermined synthesis temperature;
(d) further treating the substrate by directing the rf oxygen plasma stream at the synthesis surface of the substrate at a predetermined dynamical pressure for a predetermined period of time;
(e) implementing film synthesis on the synthesis surface of the substrate by:
(e1) activating and operating a metal oxide plasma generating subsystem that is configured and operative to interact with a metal oxide target material to generate and direct a high-energy metal, oxide plasma plume at the synthesis surface of the substrate under predetermined synthesis conditions; and
(e2) operating a source material subsystem at a synthesis temperature within a predetermined range to generate and direct a directed stream of elemental dopant material at the synthesis surface of the substrate;
such that a doped film is synthesized on the substrate;
(f) terminating doped film synthesis once a predetermined synthesis parameter has been achieved;
(g) treating the doped film synthesized on the substrate by directing a second rf oxygen plasma stream at the synthesized doped film for a predetermined treatment period at a predetermined dynamical pressure;
(h) decreasing, upon lapse of the predetermined treatment period, the substrate temperature at a predetermined rate of change to stabilize the substrate at room temperature; and
(i) terminating the second rf oxygen plasma stream in the deposition chamber once the substrate has been stabilized at room temperature;
wherein the doped film synthesized on the substrate and the substrate in combination define a semiconducting composite structure characterized by the doped film synthesized on the substrate.

2. The hybrid beam deposition method of claim 1 wherein the doped film synthesized on the substrate is a doped metal oxide film such that the semiconducting composite structure synthesized by the hybrid beam deposition method is a doped metal oxide semiconducting composite structure.

3. The hybrid beam deposition method of claim 2 wherein the metal oxide target material is polycrystalline ZnO such that the doped metal oxide film synthesized on the substrate is a doped ZnO film; and wherein the semiconducting composite structure synthesized by the hybrid beam deposition method is a doped ZnO semiconducting composite structure.

4. The hybrid beam deposition method of claim 2 wherein the dopant material of the source material subsystem is a p-type dopant such that the doped metal oxide film synthesized on the substrate is a p-type metal oxide film; and wherein the semiconducting composite structure synthesized by the hybrid beam deposition method is a p-type metal oxide semiconducting composite structure.

5. The hybrid beam deposition method of claim 3 wherein the dopant material of the source material subsystem is a p-type dopant such that the doped ZnO film synthesized on the substrate is a p-type ZnO film; and wherein the semiconducting composite structure synthesized by the hybrid beam deposition method is a p-type ZnO semiconducting composite structure.

6. The hybrid beam deposition method of claim 2 wherein the dopant material of the source material subsystem is an n-type dopant such that the doped metal oxide film synthesized on the substrate is an n-type metal oxide film; and wherein the semiconducting composite structure synthesized by the hybrid beam deposition method is an n-type metal oxide semiconducting composite structure.

7. The hybrid beam deposition method of claim 3 wherein the dopant material of the source material subsystem is an n-type dopant such that the doped ZnO film synthesized on the substrate is an n-type ZnO film; and wherein the semiconducting composite structure synthesized by the hybrid beam deposition method is an n-type ZnO semiconducting composite structure.

8. The hybrid beam deposition method of claim 1 further comprising the step of:
(e3) further operating the source material subsystem at a synthesis temperature within a predetermined range to generate and direct a directed stream of elemental source material at the synthesis surface of the substrate;
wherein the doped film synthesized on the substrate is a doped metal-based oxide alloy film such that the semiconducting composite structure synthesized by the hybrid beam deposition method is a doped metal-based oxide alloy semiconducting composite structure.

9. The hybrid beam deposition method of claim 8 wherein the metal oxide target material is polycrystalline ZnO such that the doped metal-based oxide alloy film synthesized on the substrate is a doped ZnO-based alloy film; and wherein the semiconducting composite structure is a doped ZnO-based alloy semiconducting composite structure.

10. The hybrid beam deposition method of claim 9 wherein the source material used by the source material subsystem to generate the directed stream of elemental source material is a binary compound selected from a group of binary compounds consisting of BeO, MgO, CaO, SrO, BaO, CdO, HgO, ZnS, ZnSe, ZnTe, CdTe, CdS, CdSe, MgSe, and MgTe to modulate the bandgap of the ZnO-based alloy film being synthesized.

11. The hybrid beam deposition method of claim 9 wherein the source material used by the source material subsystem to generate the directed stream of elemental source material is a quaternary compound selected from a group of quaternary compounds consisting of ZnCdOSe and ZnCdOS to modulate the bandgap of the ZnO-based alloy film being synthesized.

12. The hybrid beam deposition method of claim 8 wherein the dopant material used by the source material subsystem to generate the directed stream of elemental dopant material is a p-type dopant such that the doped metal-based oxide alloy film synthesized on the substrate is a p-type metal-based oxide alloy film; and wherein the semiconducting composite structure synthesized by the hybrid beam deposition method is a p-type metal-based oxide alloy semiconducting composite structure.

13. The hybrid beam deposition method of claim 9 wherein the dopant material used by the source material subsystem to generate the directed stream of elemental dopant material is a p-type dopant such that doped ZnO-based alloy film synthesized on the substrate is a p-type ZnO-based alloy film; and wherein the semiconducting composite structure synthesized by the hybrid beam deposition method is a p-type ZnO-based alloy semiconducting composite structure.

14. The hybrid beam deposition method of claim 8 wherein the dopant material used by the source material subsystem to generate the directed stream of elemental dopant material is an n-type dopant such that the doped metal-based oxide alloy film synthesized on the substrate is an n-type metal-based oxide alloy film; and wherein the semiconducting composite structure synthesized by the hybrid beam deposition method is an n-type metal-based oxide alloy semiconducting composite structure.

15. The hybrid beam deposition method of claim 9 wherein the dopant material used by the source material subsystem to generate the directed stream of elemental dopant material is an n-type dopant such that doped ZnO-based alloy film synthesized on the substrate is an n-type ZnO-based alloy film; and wherein the semiconducting composite structure synthesized by the hybrid beam deposition method is an n-type ZnO-based alloy semiconducting composite structure.

16. The hybrid beam deposition method of claim 1 wherein the source material subsystem operating step comprises varying the synthesis temperature of the source material used by the source material subsystem within the predetermined range to vary the concentration of the directed stream of elemental dopant material such that the carrier concentration of the doped film synthesized on the substrate is varied.

17. The hybrid beam deposition method of claim 1 wherein the predetermined dynamical pressure for the rf oxygen plasma stream is within a range of about $1\times10^{-6}$ Torr to about $1\times10^{-2}$ Torr.

18. The hybrid beam deposition method of claim 2 further comprising the step of:
(j) adhering ohmic contacts to the doped metal oxide semiconducting composite structure to form a doped metal oxide semiconductor device.

19. The hybrid beam deposition method of claim 3 further comprising the step of:
(j) adhering ohmic contacts to the doped ZnO semiconducting composite structure to form a doped ZnO semiconductor device.

20. The hybrid beam deposition method of claim 4 further comprising the step of
(j) adhering ohmic contacts to the p-type metal oxide semiconducting composite structure to form a p-type metal oxide semiconductor device.

21. The hybrid beam deposition method of claim 5 further comprising the step of:
(j) adhering ohmic contacts to the p-type ZnO semiconducting composite structure to form a p-type ZnO semiconductor device.

22. The hybrid beam deposition method of claim 6 further comprising the step of:
(j) adhering ohmic contacts to the n-type metal oxide semiconducting composite structure to form an n-type metal oxide semiconductor device.

23. The hybrid beam deposition method of claim 7 further comprising the step of:
(j) adhering ohmic contacts to the n-type ZnO semiconducting composite structure to form an n-type ZnO semiconductor device.

24. The hybrid beam deposition method of claim 8 further comprising the step of:
(j) adhering ohmic contacts to the doped metal-based oxide alloy semiconducting composite structure to form a doped metal-based oxide alloy semiconductor device.

25. The hybrid beam deposition method of claim 9 further comprising the step of:
(j) adhering ohmic contacts to the doped ZnO-based alloy semiconducting composite structure to form a doped ZnO-based alloy semiconductor device.

26. The hybrid beam deposition method of claim 12 further comprising the step of:
(j) adhering ohmic contacts to the p-type metal-based oxide alloy semiconducting composite structure to form a p-type metal-based oxide alloy semiconductor device.

27. The hybrid beam deposition method of claim 13 further comprising the step of:
(j) adhering ohmic contacts to the p-type ZnO-based alloy semiconducting composite structure to form a p-type ZnO-based alloy semiconductor device.

28. The hybrid beam deposition method of claim 14 further comprising the step of:
(j) adhering ohmic contacts to the n-type metal-based oxide alloy semiconducting composite structure to form an n-type metal-based oxide alloy semiconductor device.

29. The hybrid beam deposition method of claim 15 further comprising the step of:
(j) adhering ohmic contacts to the n-type ZnO-based alloy semiconducting composite structure to form an n-type ZnO-based alloy semiconductor device.

* * * * *